United States Patent
Huck

(10) Patent No.: US 11,876,504 B2
(45) Date of Patent: Jan. 16, 2024

(54) ELECTRO ACOUSTIC RESONATOR WITH SUPPRESSED TRANSVERSAL GAP MODE EXCITATION AND REDUCED TRANSVERSAL MODES

(71) Applicant: RF360 SINGAPORE PTE. LTD., Singapore (SG)

(72) Inventor: Christian Huck, Munich (DE)

(73) Assignee: RF360 Singapore Pte. Ltd., San Diego, CA (US)

( * ) Notice: Subject to any disclaimer, the term of this patent is extended or adjusted under 35 U.S.C. 154(b) by 314 days.

(21) Appl. No.: 17/294,638

(22) PCT Filed: Nov. 28, 2019

(86) PCT No.: PCT/EP2019/082928
§ 371 (c)(1),
(2) Date: May 17, 2021

(87) PCT Pub. No.: WO2020/120153
PCT Pub. Date: Jun. 18, 2020

(65) Prior Publication Data
US 2021/0313961 A1    Oct. 7, 2021

(30) Foreign Application Priority Data
Dec. 12, 2018   (DE) ..................... 10 2018 131 952.5

(51) Int. Cl.
*H03H 9/25*   (2006.01)
*H03H 3/08*   (2006.01)
(Continued)

(52) U.S. Cl.
CPC ............... *H03H 9/25* (2013.01); *H03H 3/08* (2013.01); *H03H 9/02858* (2013.01);
(Continued)

(58) Field of Classification Search
CPC ........ H03H 9/25; H03H 3/08; H03H 9/02858; H03H 9/02992; H03H 9/145; H03H 9/6406
See application file for complete search history.

(56) References Cited

U.S. PATENT DOCUMENTS

2008/0315972 A1* 12/2008 Mayer ................ H03H 9/02992
310/313 R
2016/0072475 A1   3/2016 Mimura et al.
(Continued)

FOREIGN PATENT DOCUMENTS

CN         105745840 A  *  7/2016  ........... H01L 41/047
DE    112017003190 T5  *  3/2019  ......... H03H 9/02637
(Continued)

OTHER PUBLICATIONS

International Search Report and Written Opinion—PCT/EP2019/082928—ISA/EPO—dated Mar. 23, 2020.

*Primary Examiner* — Adam D Houston
(74) *Attorney, Agent, or Firm* — Polsinelli

(57) ABSTRACT

An electro acoustic resonator is provided. The resonator has a gap short structure (GSS) to electrically short at least an area of the transversal gap to suppress transversal gap mode excitations. The gap short structure may be provided by a conductive stripe in the gap and parallel to or inclined with respect to the bus bar (BB) shorting adjacent IDT fingers. Additional connectors between the stripe and the bus bar may be provided. The connectors may have different pitch or metallization ratio with respect to the ID fingers. The connectors may be offset from the position of the fingers and my be inclined with respect to the bus bars. Multiple parallel stripes in the gap may provide a transversal reflector. By using a gap short structure a further improved transversal mode suppression of piston mode designs can be achieved.

14 Claims, 21 Drawing Sheets

(51) Int. Cl.
  *H03H 9/02* (2006.01)
  *H03H 9/145* (2006.01)
  *H03H 9/64* (2006.01)

(52) U.S. Cl.
  CPC ........ *H03H 9/02992* (2013.01); *H03H 9/145* (2013.01); *H03H 9/6406* (2013.01)

(56) References Cited

U.S. PATENT DOCUMENTS

| | | | |
|---|---|---|---|
| 2016/0126928 A1 | 5/2016 | Ruile et al. | |
| 2021/0126616 A1* | 4/2021 | Hiramatsu | H03F 3/72 |
| 2021/0167756 A1* | 6/2021 | Yantchev | H03H 3/02 |
| 2021/0265972 A1* | 8/2021 | Daimon | H03H 9/25 |
| 2021/0313961 A1* | 10/2021 | Huck | H03H 9/02992 |
| 2021/0344323 A1* | 11/2021 | Ebner | H03H 3/08 |
| 2022/0109419 A1* | 4/2022 | Esquius Morote | H03H 9/02685 |
| 2022/0311409 A1* | 9/2022 | Geselbracht | H03H 9/25 |
| 2023/0071909 A1* | 3/2023 | Daimon | H03H 9/14582 |
| 2023/0155569 A1* | 5/2023 | Yamane | H03H 9/173 310/365 |
| 2023/0223915 A1* | 7/2023 | Koulakis | H03H 3/02 333/186 |

FOREIGN PATENT DOCUMENTS

| | | | | |
|---|---|---|---|---|
| DE | 102018130144 A1 * | 5/2020 | ........... | H03H 9/0542 |
| DE | 102018131952 A1 * | 6/2020 | ............... | H03H 3/08 |
| JP | S5654114 A | 5/1981 | | |
| JP | H10173467 A | 6/1998 | | |
| JP | 2003188676 A | 7/2003 | | |
| JP | 2006157307 A | 6/2006 | | |
| JP | 2008103953 A | 5/2008 | | |
| JP | 2012253738 A | 12/2012 | | |
| JP | 2015056746 A | 3/2015 | | |
| JP | 2015119413 A * | 6/2015 | ............... | H03H 3/08 |
| KR | 20120120355 A * | 11/2012 | | |
| WO | WO-2006109591 A1 * | 10/2006 | ........... | H03H 9/0071 |
| WO | WO-2011088904 A1 * | 7/2011 | ............... | H03H 3/08 |
| WO | WO-2017161303 A1 * | 9/2017 | ......... | H03H 9/02858 |
| WO | 2018199071 A1 | 11/2018 | | |
| WO | WO-2020109082 A1 * | 6/2020 | ........... | H03H 9/0542 |
| WO | WO-2020120153 A1 * | 6/2020 | ............... | H03H 3/08 |
| WO | WO-2021219794 A1 * | 11/2021 | ........ | H03H 9/02559 |

* cited by examiner

BB  BBC  GSS

[dB]

f [MHz]

f [MHz]

ELECTRO ACOUSTIC RESONATOR WITH SUPPRESSED TRANSVERSAL GAP MODE EXCITATION AND REDUCED TRANSVERSAL MODES

The present invention refers to electro acoustic resonators with suppressed transversal gap mode excitations and reduced transversal modes, to electro acoustic filters, to methods of manufacturing a resonator and to methods of reducing the aforementioned spurious modes.

Electro acoustic resonators can be used to establish RF filters, e.g. for wireless mobile communication devices.

Electro acoustic resonators have an electrode structure and a piezoelectric material.

Due to the piezoelectric effect an electro acoustic resonator converts between electromagnetic RF signals and acoustic RF signals. From the publication WO 2011/088904 A1 transducer structures for electro acoustic resonators for obtaining a piston mode are known. A transversal acoustic waveguide with reduced transversal modes is implemented by adjusting a transversal acoustic velocity profile.

A transversal acoustic waveguide is implemented by using a transversal gap with higher wave velocity which allows the reduction of leakage of acoustic waves in a transversal direction. However, due to wave diffraction transversal modes can be excited which show up in admittance curves as peaks and in corresponding filters as dips inside the passband. In the above-mentioned piston mode these transversal modes may be suppressed by adjusting the transversal acoustic velocity profile.

However, in some material systems, e.g. TFSAW, the conventional piston mode approach may not be sufficient for acceptable transversal mode suppression and additional modes in the transversal gap region, called transversal gap modes, may be excited which disturb the filter performance significantly.

Thus, what is wanted is an electro acoustic resonator with a further improved performance, especially with suppressed transversal gap mode excitations and reduced transversal modes resulting in corresponding improvements in passband performance of filters. Further, what is wanted is an electro acoustic resonator that can improve the transition steepness between a passband and a stopband in filters, especially when losses are reduced. Further, new degrees of freedom for resonator optimization are wanted. Corresponding resonators and filters should be manufacturable with conventional manufacturing steps without an increase in complexity and costs.

To that end, an electro acoustic resonator with suppressed transversal gap mode excitations and reduced transversal modes according to independent claim 1 is provided. Dependent claims provide preferred embodiments.

The electro acoustic resonator with suppressed transversal gap mode excitations and reduced transversal modes comprises a piezoelectric material and an electrode structure. The electrode structure is arranged on or above the piezoelectric material. The resonator further comprises a gap short structure arranged on or above the piezoelectric material. The electrode structure has two opposite busbars, two transversal gaps and electrode fingers. Each electrode finger is electrically connected to one of the two busbars. The transversal gaps are arranged between the end of the electrode fingers and the respective opposite busbar. The gap short structure has conductor strips and is arranged inside the transversal gaps.

The electrode fingers and the busbars of the electrode structure establish an interdigitated structure where the electrode fingers interdigitate each other and have a comb-like structure. A corresponding electromagnetic RF signal can be applied to the busbars. The busbars provide the electromagnetic RF signal to the corresponding electrode fingers that are electrically connected to the busbar. Usually, the electrode fingers have an extension in the transversal direction and convert between electromagnetic and acoustic RF signals. The acoustic RF signals propagate in the longitudinal direction that is mainly orthogonal to the extension direction of the electrode fingers. The acoustic waves propagate at the surface or at the interface of the piezoelectric material. The electrode fingers are electrically connected with one of their ends to the corresponding busbar. The respective other end is arranged at a distance to the opposite busbar. Otherwise, the two busbars would be short-circuited. The transversal gap (or just gap) is the area within the acoustic track between the electrode fingers and the opposite busbar. Thus, an acoustic track usually has two transversal gaps. One gap is arranged between one of the busbars and the central excitation area in which the electrode fingers of opposite polarity overlap. The respective other gap is arranged between the central excitation area and the respective other, opposite busbar. The gaps have an extension along the longitudinal direction and are essentially parallel to the busbars.

It is possible that the gap short structure with its conductor strips electrically shorts an area of the gaps.

The conductor strips of the gap short structure can have an extension along the longitudinal direction. Specifically, it is possible that the gap structure comprises at least two conductor strips, e.g. one conductor strip for each side of the acoustic track. The conductor strips can essentially be arranged parallel to the busbars in both gaps between the central excitation area and the busbars.

The conductor strips are made of a conducting material. The conductor strips can comprise at least one layer of a metal.

The conductor strips can be electrically connected to the corresponding busbar that is arranged closest to the conductor strip.

The establishment of the velocity profile of WO 2011/088904 A1 is based on an acoustic interaction between additional or removed material and the acoustic waves in order to form an acoustic waveguide with a piston mode.

The gap short structure effects the present electro acoustic resonator additionally in an electrical fashion. In particular, it is possible that the gap short structure reduces or prevents electrical fields within the area of the gaps denoted above resulting in a suppression of transversal gap mode excitations. The shorting effect of the gap short structure with its conductor strips keeps the corresponding area field free or reduces the electrical field such that a reduction or elimination of transversal gap modes can be obtained.

Additionally, it was found that transversal modes can be further suppressed compared to a conventional piston mode design when a gap short structure is present. By a modification of the acoustic velocity barrier and its shape in the transversal gap region the piston mode working point is changed which improves the transversal mode suppression.

It is possible that the conductor strips of the gap short structure extend in a longitudinal direction, i.e. mainly parallel to the busbars.

Then, the gap short structure divides the gaps into different areas. Especially the area between the conductor strips next to the central excitation area and the busbar is relevant since its contribution to the excitation of transversal gap modes is reduced significantly.

It is possible that the conductor strips of the gap short structure and the electrode fingers share a same metal layer.

It is possible that the electrode fingers have a layered construction. The electrode fingers can be arranged on the piezoelectric material. An adhesion layer between the electrode fingers and the piezoelectric material is also possible. The layered construction can comprise the adhesion layer and further layers that ensure a low ohmic resistance and good acoustic properties and a high power durability.

When the gap short structure and the electrode fingers or other parts of the electrode structures share a same metal layer then the same processing steps needed for the manufacturing of the electrode fingers or of the electrode structure can be utilized to also establish the gap short structure.

Especially, it is possible that the layer construction of the gap short structure equals or is contained in the layer construction of the electrode fingers. Then, with the corresponding adjusted topology layout, the same manufacturing steps for establishing the electrode structure and/or the electrode fingers at one side and the gap short structure on the other side can be used.

It is possible that the resonator is selected from a SAW resonator, a TC-SAW resonator, a TF-SAW resonator and a GBAW resonator which may be realized in form of an one-port resonator, a two-port resonator or a DMS-resonator. A SAW resonator (SAW=surface acoustic wave) utilizes acoustic waves propagating at the top surface of the piezoelectric material. The piezoelectric material can be a bulk material and consists of or comprises a monocrystalline piezoelectric material.

A TF-SAW resonator (TF-SAW=thin film-SAW) has its piezoelectric material provided as a thin film. Thus, the piezoelectric thin film material is provided via wafer bonding and thin film processing techniques, e.g. mechanical polishing or smart cut, or via thin film layer deposition techniques such as CVD (chemical vapor deposition), PVD (physical vapor deposition), sputtering or MBE (MBE=molecular beam epitaxy).

A GBAW resonator (GBAW=guided bulk acoustic wave) has the acoustic wave propagating at or above an interface between the piezoelectric material and a layer on the piezoelectric material and/or the electrode structure such that an acoustic waveguide—with respect to a vertical direction—is obtained.

A one port resonator has one port (=2 connections) only; a two port resonators has two ports (=4 connections). One port can be an input port for receiving RF signals. The respective other port can be an output port for transmitting RF signals to an external circuit environment.

A DMS-resonator (DMS=Dual Mode SAW) has two or more interdigitated transducers between the reflector's elements and two or more wanted acoustic modes can propagate.

It is possible that the resonator further comprises busbar connectors. The busbar connectors electrically connect the gap short structure to the busbars.

Specifically, it is possible that the resonator comprises busbar connectors that electrically connect the gap short structure at one side of the acoustic track to the busbar of the same side. Further, busbar connectors electrically connect the gap short structure on the respective opposite side to its busbar.

It is possible that the busbar connectors comprise conductor patches that extend across the area of reduced or eliminated electrical field strengths in the transversal gap region.

It is possible that the busbar connectors comprise one or more structures selected from electrode finger elements, phase shifted electrode finger elements, phase shifted conductor patches, electrode finger elements with an increased metallization ratio $\eta$, electrode finger elements with a reduced metallization ratio $\eta$, asynchronous conductor patches with an increased pitch p, asynchronous conductor patches with a reduced pitch p, asynchronous conductor patches with an irregular pitch p (e.g. aperiodic, random or chirped), rotated conductor patches and trapezoid conductor patches. In case of a TGR structure busbar connector conductor patches which are (arbitrarily) modified from one gap short conductor strip to the next, e.g. stepwise phase-shifted, distorted or rotated.

A simple way to establish the busbar connectors is to utilize the material of the electrode fingers that electrically connects the segments of the electrode fingers in the central excitation area with the busbars and that go across the area of reduced electrical field strength in the transversal gap region.

However, due to the existence of the gap short structure it is possible to shift these finger elements in the gap region with respect to their longitudinal position in the central excitation area to influence the phase of the corresponding acoustic waves that can propagate in the longitudinal direction in this area to further decrease the excitation of transversal gap modes.

Instead of material of the electrode fingers, additional conductor patches or conductor patches having a different construction can be used. Specifically, at positions where no electrode fingers are present additional conductor patches can be provided to reduce the ohmic resistance between the busbars and the gap short structures' elements.

The metallization ratio $\eta$ is defined as the finger width divided by the pitch p. The finger pitch p is defined as the distance between finger or conductor patch edges of adjacent fingers or conductor patches that point towards the same direction.

Manipulating the metallization ratio $\eta$ and/or the pitch p provides additional degrees of freedom in shaping the acoustic modes that can be excited or propagate in the resonator.

Corresponding conductor patches can be shifted in the longitudinal direction or can have a different pitch compared to the finger structures in the central excitation area to obtain phase shifted structures.

It is possible that the conductor strips of the gap short structure comprise one or more structure selected from rectangular conductor strips, rotated conductor strips, trapezoid conductor strips and a plurality of conductor strips per side of the acoustic track. A plurality of conductor strips establishes a transversal gapshort reflector.

It is possible to use such a resonator in an electro acoustic filter to establish a band pass filter or a band rejection filter with improved performance.

The corresponding filter can have a ladder-type like circuit topology or a lattice-type like circuit topology. For example in a ladder-type like circuit topology series resonators are electrically connected in a signal path between a first port and a second port. Parallel resonators can be arranged in parallel paths electrically connecting the signal path to a ground potential.

The filter can be used in a multiplexer, e.g. in a duplexer, a quadplexer or a multiplexer of a higher order.

A method of manufacturing a resonator can comprise the step of creating the conductor strips of the gap short structure in the gaps.

Specifically when the construction of the gap short structure and/or the gap short structures' conductor strips and busbar connectors have the same layer configuration and construction like the electrode fingers, then no additional processing steps are needed because the gap short structure can be established simultaneously with the electrode structure utilizing the same materials.

A method of reducing the excitation of transversal gap modes in an electro acoustic resonator comprises the step of electrically shorting an area of the resonator's transversal gaps.

Specifically, it is possible that the resonator's transversal gaps are shorted via a gap short structure. The gap short structure can be provided as conductive strips. The widths of the strips as well as the distances between the strips and the electrode fingers, between the strips and the busbars, and between adjacent strips in case of TGR (transversal gap short reflector) can be determined to improve the electrical and the acoustic behaviour of the resonator. By this, resonators with suppressed transversal gap mode excitation and reduced transversal modes can be provided resulting in corresponding filters with improved performance, e.g. regarding insertion attenuation, passband ripples and skirt steepness.

It is possible to provide a TGR (transversal gap short reflector) comprising a plurality of strips extending in the longitudinal direction as the gap short structure. The distance between the gap short structure and the electrode finger tips and the distance between the gap short structure and the busbar together with the number of strips, the width of the strips and the distance between individual strips are determined such that good electro mechanical properties are obtained.

With the above-described means it is possible to provide resonators with reduced transversal modes at about 1963 MHz, 1980 MHz and 1998 MHz. A suppression of transversal modes at these frequencies is difficult with conventional means. However, the provided resonators can practically eliminate transversal modes at these frequencies.

It is possible that in one port resonators the admittance, e.g. at about 2020 MHz, can be improved by reducing a transversal gap mode by more than 20 dB.

The addition or the removal of conducting or dielectric matter at specific locations in the acoustic track or in the vicinity of the acoustic track to further improve the electrical or acoustic behaviour of the resonator is also possible. To that end, additional dielectric or conducting patches can be added. Also, at specific locations dielectric or conducting material can be locally removed.

Central aspects of the provided electro acoustic resonator and its working principles and details of preferred embodiments are shown in the accompanying schematic figures.

Figure 1:
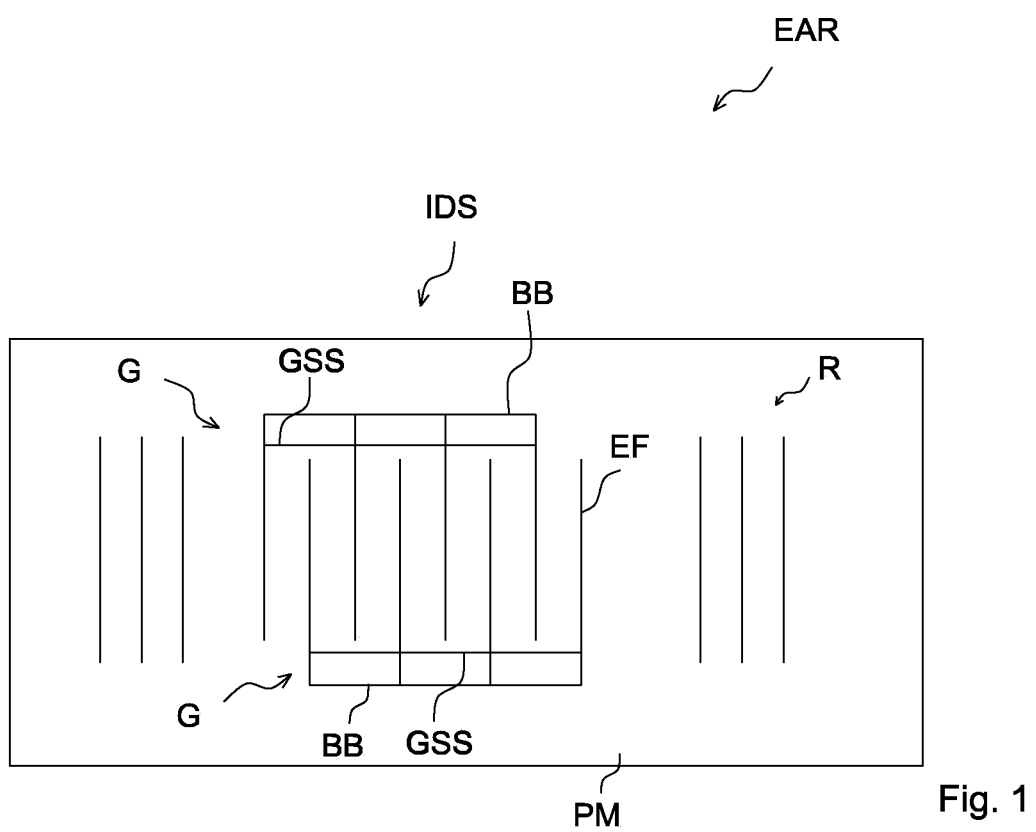
FIG. 1 shows basic construction elements of an electro acoustic resonator.

FIG. 1 shows general aspects of an electro acoustic resonator EAR. The resonator has a piezoelectric material PM on which an interdigitated structure IDS is arranged. The interdigitated structure IDS comprises interdigitating electrode fingers EF. Each electrode finger EF is connected to one of two busbars BB. The interdigitated structure IDS is arranged between acoustic reflectors R comprising reflector fingers. Mainly parallel to the busbars BB the electro acoustic resonator EAR has gap short structures GSS having the effect that the area between the gap short structure GSS and their corresponding busbars BB are essentially free of an electrical field. The gap short structure GSS comprises conductor strips that are essentially parallel to the conductor strips of the busbars BB and arranged in the transversal gap region G between the ends of the electrode fingers EF and the busbars BB of the opposite polarity.

By providing the gap short structure on the piezoelectric material PM the electric field strength in the portion of the transversal gap between BB and GSS is eliminated or at least strongly reduced, thus, reducing or eliminating the excitation of transversal gap modes To that end, the conductor patches of the gap short structure GSS are kept at an essentially same potential as the accompanying busbar BB.

Figure 2:
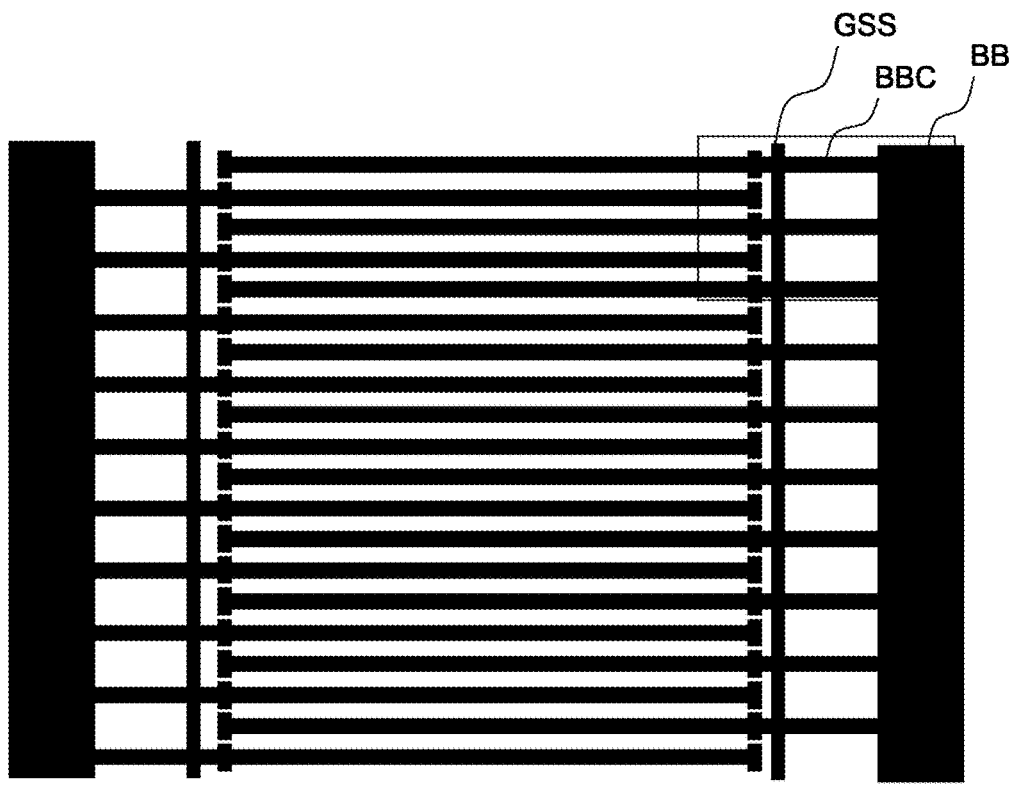
FIG. 2 shows a possible implementation of the gap short structure.

FIG. 2 shows a possible implementation of the gap short structure GSS which is established as a conductor strip extending along the longitudinal direction parallel to the busbars BB.

Further, the acoustic track shown in FIG. 2 shows conductor patches that are arranged at the ends of the electrode fingers and at corresponding lateral positions of the electrode fingers of the opposite polarity such that the acoustics of the resonator is improved by establishing a piston mode with reduced transversal modes.

Thus, the structure shown in FIG. 2 provides acoustically and electrically active means for suppressing the excitation of transversal gap modes and (further) reducing transversal modes at the same time.

Figure 3:
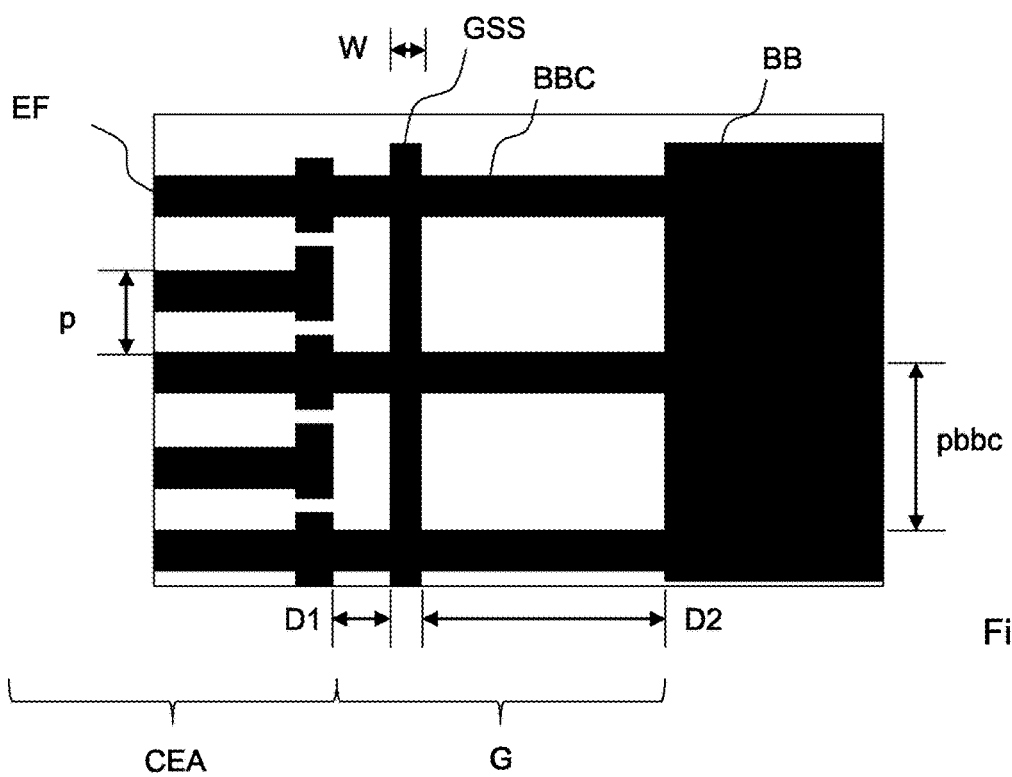
FIG. 3 illustrates an enlarged view of a section of the acoustic track shown in FIG. 2.

FIG. 3 illustrates a zoomed section of FIG. 2 into the transversal gap region showing the definition of the finger pitch p in the central excitation area and the respective pitch pbbc of the conductor strips of the busbar connectors. The gap short structure GSS has a rectangular cross-section. The gap short structure extends along the longitudinal direction parallel to the busbar BB. The busbar connectors BBC electrically connect the gap short structure GSS to the busbar BB such that a field reduction in the transversal gap G can be obtained. The gap G is arranged between the central excitation area CEA and the busbar BB. The busbar connector is established in the example of FIG. 3 by the corresponding segments of the electrode fingers EF in the gap G between the gap short structure GSS and the busbar BB. Characteristic properties that determine the effect of the gap short structure GSS in this simplest embodiment are the structure's width W and the distances D1 and D2 to the electrode finger ends of the opposite electrode and to the busbar, respectively.

The electrode finger pitch p is defined as the distance of edges of adjacent electrode fingers pointing in the same direction, e.g. arranged at the upper side shown in FIG. 3.

Correspondingly, the pitch pbbc of the busbar connectors BBC is defined as the distance of edges of adjacent busbar connectors pointing in the same direction.

Similarly, the metallization ratio is defined as the finger width or busbar connector width divided by the corresponding finger pitch or busbar connector pitch.

Since the gap short structure should be applicable for various frequency bands all parameters characterizing the gap short structure should be defined in units of the pitch of the central excitation area. By this, scaling of the entire resonator including the gap short structure to different frequency bands is easily possible.

FIGS. 4 to 13 show various specific embodiments of the gap short structure.

Figure 4:
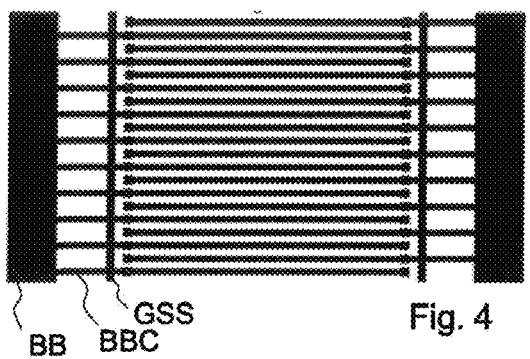
FIGS. 4 to 13 show specific embodiments of the gap short structure.

FIG. 4 shows the easiest embodiment of the gap short structure according to FIGS. 2 and 3 with a design of the acoustic track where the gap short structure is realized as two rectangular strips (one per side of the acoustic track) inside the transversal gap region. The busbar connectors BBC are realized as the corresponding finger segments between the busbar BB and the gap short structure GSS. Finger ends and corresponding finger segments at the vertical position of the finger ends of the respective other polarity fingers have a locally increased width in order to increase the mass loading in order to establish a transversal acoustic waveguide structure with a piston mode.

Figure 5:
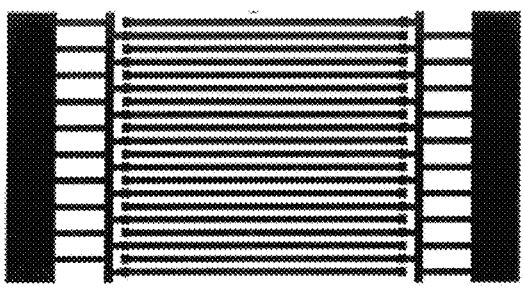

FIG. 5 shows a design with phase shifted busbar connectors. With respect to the position along the longitudinal direction the strips of the busbar connectors are shifted. The shift along the longitudinal direction corresponds to a phase shift relative to the phase of the acoustic wave inside the central excitation area. In this specific example the phase shift is chosen to be 180°.

Figure 6:
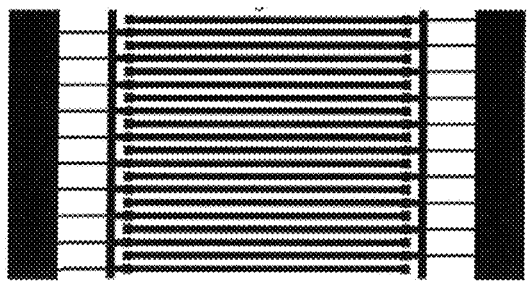

FIG. 6 shows a designs with a decreased metallization ratio for the busbar connectors. A reduced metallization ratio means that in the gap between the busbar BB and the gap short structure GSS the number of patches of the busbar connectors and/or the width (i.e. the extension along the longitudinal direction) is reduced compared to the corresponding electrode fingers of the same electrode.

Figure 7:
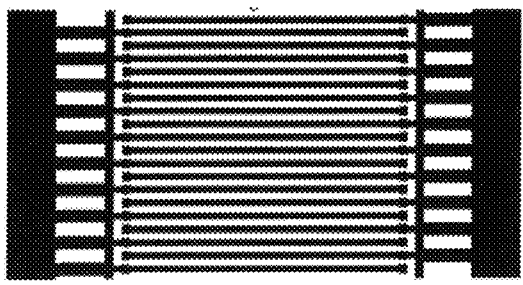

FIG. 7 shows a design with an increased metallization ratio. Similar to the design of FIG. 6, the number of busbar connector conductor patches equals the number of electrode fingers of the corresponding electrode. However, while in FIG. 6 the busbar connector conductor patches have a reduced size compared to the width of the electrode fingers, the busbar connector conductor patches in FIG. 7 have an increased size corresponding to an increased metallization ratio η.

Figure 8:

FIG. 8 shows a design with an increased pitch of the busbar connector conductor patches. The number of conductor patches of the busbar connectors is reduced compared to the number of electrode fingers of the corresponding electrode. Additionally, the width of the busbar connector conductor patches (i.e. the extension along the longitudinal direction of propagation of acoustic waves) is increased compared to the width of the electrode fingers in order to restore the same electrical conductivity of the busbar connectors like in FIG. 4.

Figure 9:
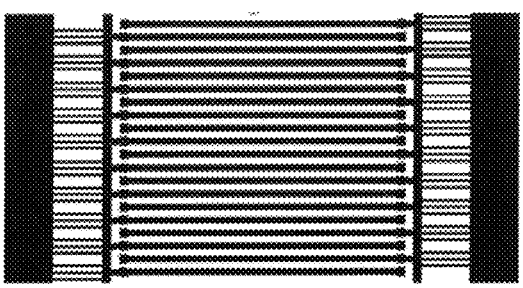

FIG. 9 shows a design where each busbar connector conductor patche of FIG. 4 is divided in three busbar connector conductor patches with reduced width. The width of the individual busbar connector conductor patches can be reduced with respect to the width of the electrode fingers to get the same electrical conductivity of the busbar connectors as before.

Figure 10:
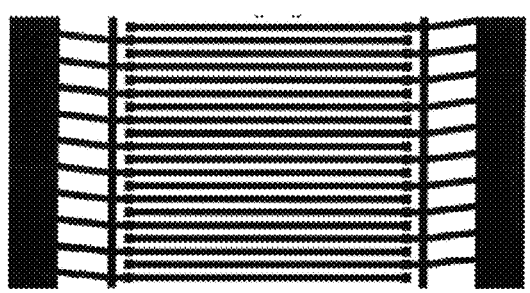
Figure 11:
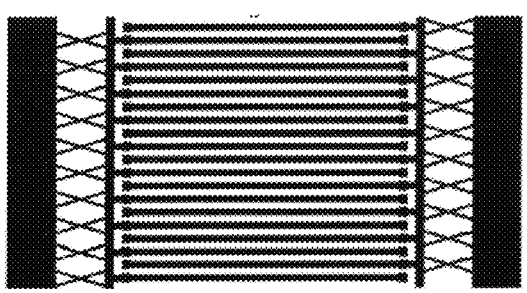

FIG. 10 shows the possibility of rotating the conductor patches of the busbar connectors. The absolute value of the rotation angle can be in the range between 1° and 60°, preferably between 5° and 15°. The rotation angle for both sides may have the same or different angle and may have the same or opposite sign resulting in a symmetric or antisymmetric structure.

Figure ii shows a design illustrating crossed conductor patches of the busbar connectors. For each electrode finger of the corresponding electrode there are two busbar connector conductor patches which cross each other inside the field free area of the transversal gap, preferably at the transversal center of the transversal gap region. Additionally, the form of the "X" is not limited to the design shown in FIG. 11. Other angles of the stripes are also possible.

Figure 12:
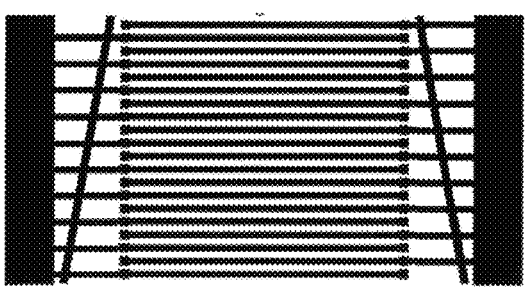

FIG. 12 shows the possibility of rotating the conductor patch of the gap short structure. Essentially the gap short structure conductor patch runs parallel to the busbars. However, a rotation with respect to a pure parallel arrangement is obtained. It is possible to span—in a transversal direction—the gap along the longitudinal extension of the acoustic track. Thus, the width of the transversal gap and the length of the interdigital transducer determine the rotation of the conductor patch of the gap short structure.

Figure 13:
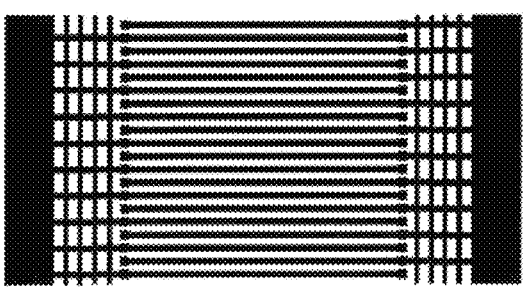

FIG. 13 shows the possibility of providing the gap short structure as a plurality of parallel strips extending along the longitudinal direction. This gap short realization is called transversal gapshort reflector (TGR). The strips can be equally spaced in the transversal direction or change its distance, e.g. linearly increasing or decreasing. The same counts for the widths of the strips which may be constant or change from strip to strip, e.g. linearly increasing or decreasing. Another degree of freedom are the busbar connector conductor patches which may be modified from one gap short conductor strip to the next, e.g. stepwise phase-shifted, distorted or rotated.

Figure 14A:
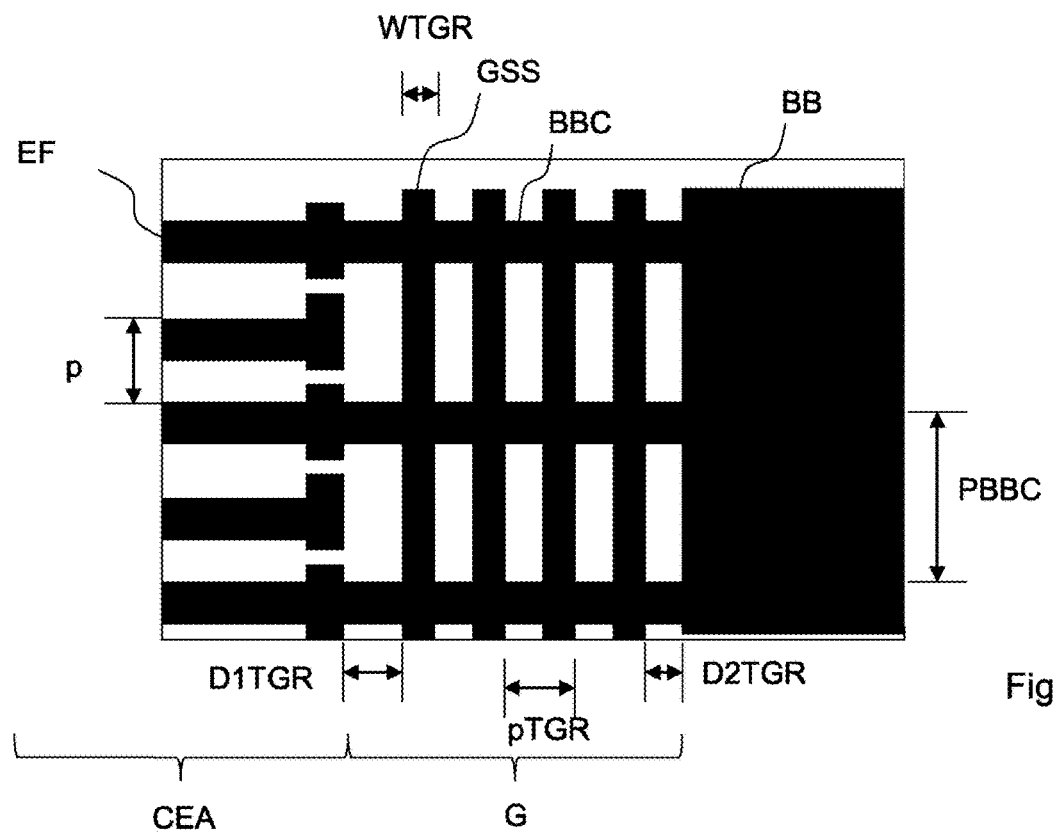
FIG. 14a illustrates an enlarged view of a section of the acoustic track shown in FIG. 13.

FIG. 14a illustrates a zoomed section of FIG. 13 into the transversal gap region showing the definition of the geometry parameters of the special transversal gapshort reflector (TGR) structure design. The pitch $p_{TGR}$ and the width $w_{TGR}$ of the strips as well as the distance $D_{tgr}$ of the adjacent strip to the finger tips should be defined in units of the longitudinal finger pitch p for easy scaling to different frequency bands. The TGR structure can have a transversal pitch PTGR Moreover, the number of strips is a parameter which needs to be defined and offers an additional degree of freedom.

In all described realizations of the gap short structure the gap short structure may be exclusively applied in the interdigital transducer area or additionally expanded to the reflectors on one or both sides of the interdigital transducer. When expanded to the reflectors it must be considered that in case of shorted reflector grids the gap short structure needs to be separated in segments at both transitions from the interdigital transducer to each reflector in order to avoid electrical shorting of both electrodes.

Figure 14B:
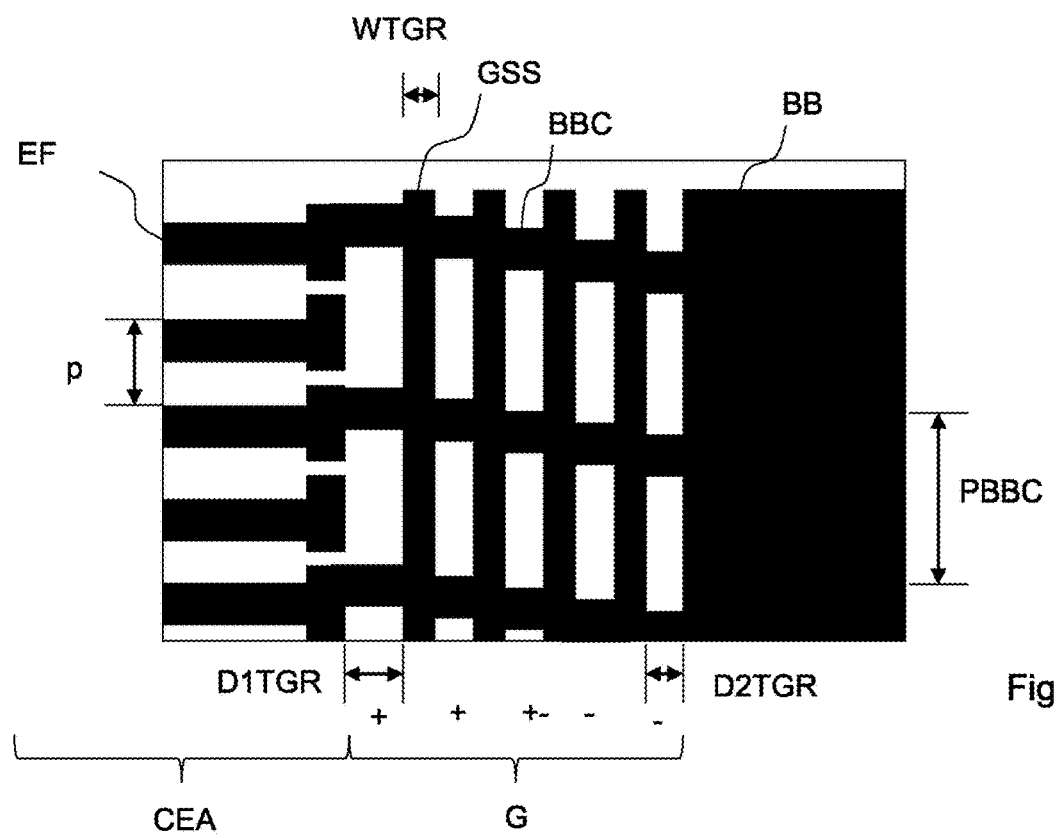
FIG. 14b illustrates a possible modification of the busbar connector conductor patches.

FIG. 14b illustrates a possible modification of the busbar connector conductor patches from one gap short conductor strip to the next in form of a stepwise phase shift resulting in a stairs structure. In general the phase-shift of the busbar connector conductor patches may be changed arbitrarily from one gap short conductor strip to the next, e.g. positive ("+") or negative ("−") phase shift like a zigzag structure.

Figure 15:
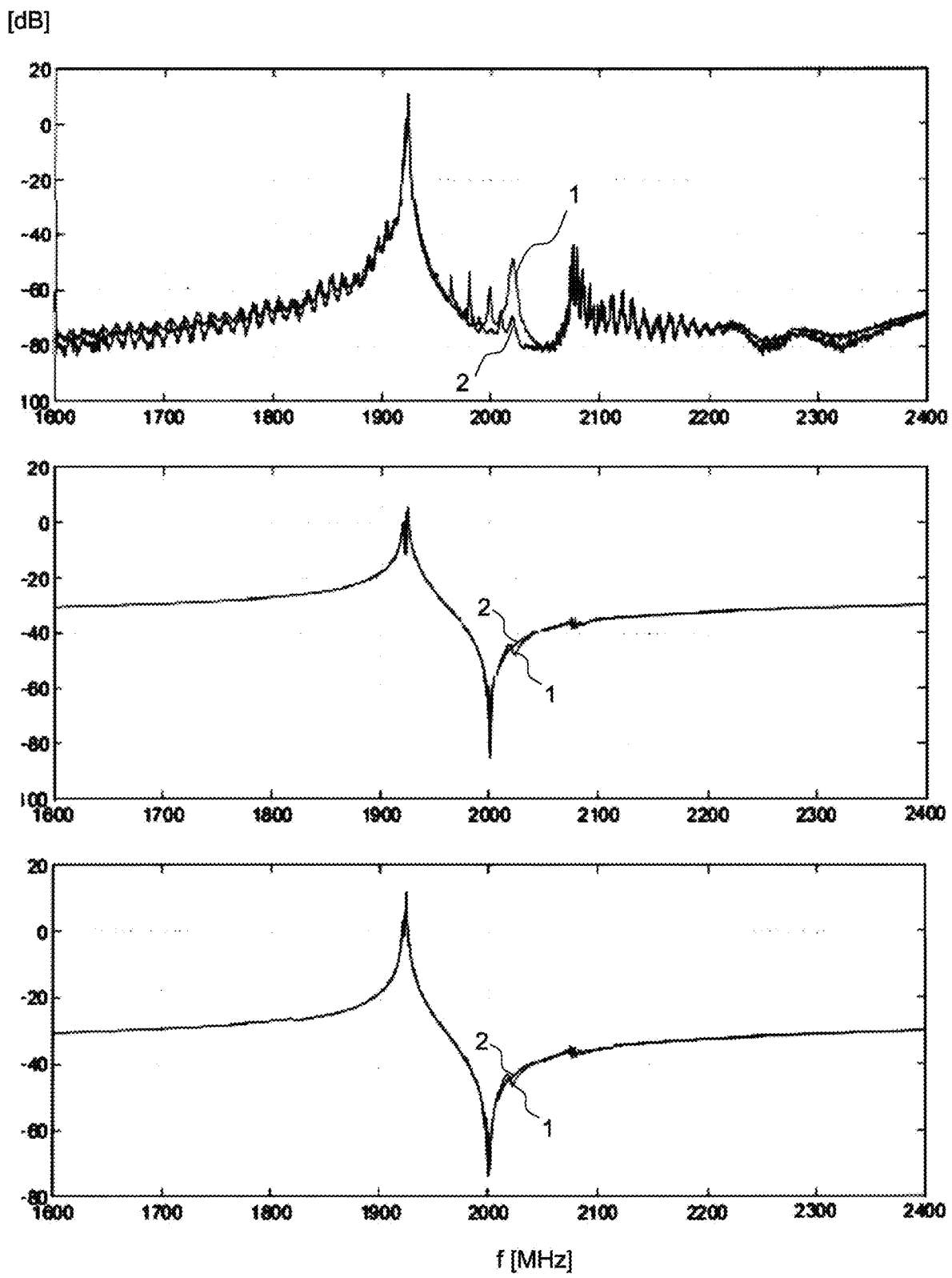
FIG. 15 shows a comparison between the real part of the admittance (top portion), the imaginary part of the admittance (center portion) and the absolute value of the admittance (bottom portion) of a conventional resonator and of a resonator with a gap short structure according to FIG. 4.

FIG. 15 shows a comparison between a conventional electro acoustic resonator and an electro acoustic resonator as described above having the gap short structure according to FIG. 4. Specifically, the top portion of FIG. 15 shows in curve 1 the real part of the admittance of a conventional electro acoustic resonator. In contrast, curve 2 shows the real part of the admittance of an improved electro acoustic resonator. Disturbances are strongly reduced in the admittance of the improved resonator, especially inside the stopband. Precisely, the excitation of the transversal gap mode at around 2020 MHz is suppressed by more than 20 dB and all peaks below this frequency and above resonance frequency caused by transversal modes are significantly reduced.

The center portion of FIG. 15 shows the corresponding curves for the imaginary part of the admittance. At approximately 2020 MHz the conventional resonator has spikes in the imaginary part of the admittance due to transversal gap mode excitation while the corresponding imaginary part of the admittance for the improved resonator is free from a disturbance in this frequency range.

The bottom part of FIG. 15 shows a comparison between the absolute values of the admittances of the conventional resonator (curve 1) and the improved resonator (curve 2). Similar to the curves of the imaginary part of the admittance, the conventional resonator shows a disturbance at 2020 MHz while the improved resonator does not.

Figure 16:
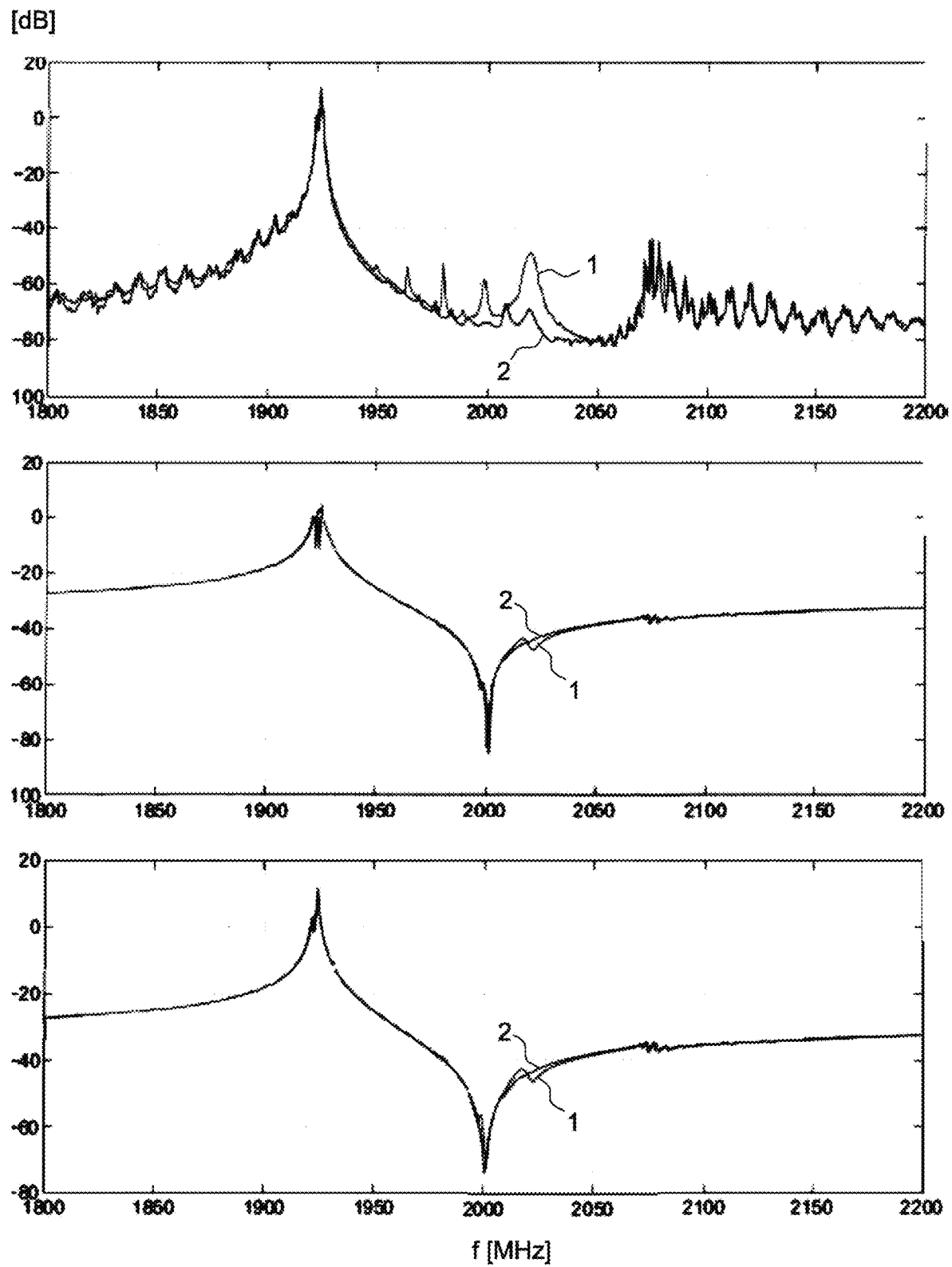
FIG. 16 shows a zoomed view of FIG. 15.

FIG. 16 shows curves 1 and 2 of FIG. 15 for a zoomed frequency range.

Figure 17:
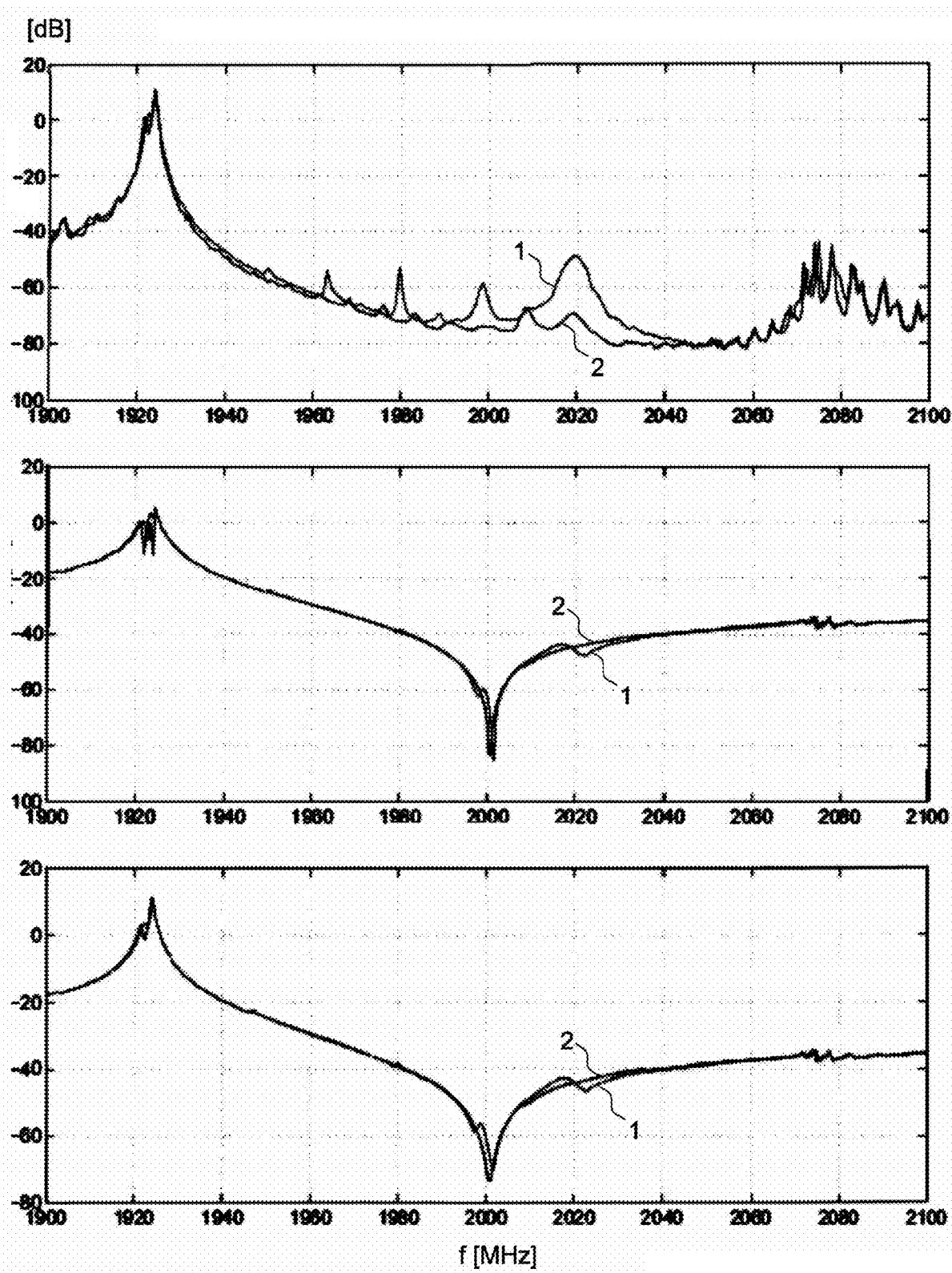
FIG. 17 shows a further zoomed view of FIG. 16.

Similarly, FIG. 17 shows a still further zoomed view of FIG. 16 with curves 1 and 2.

Figure 18:
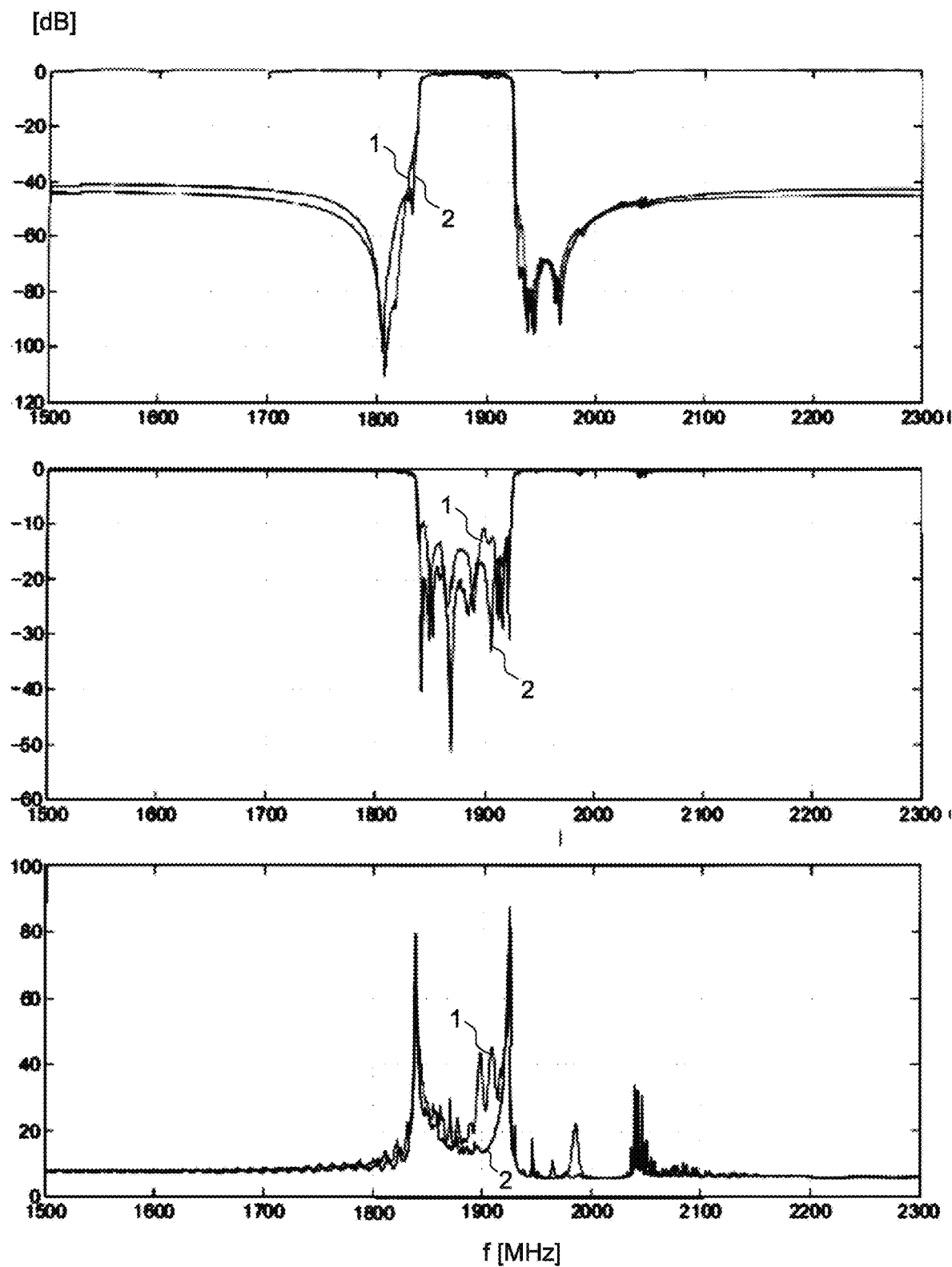
FIG. 18 shows a comparison between the transmission (top portion), input port reflection (center portion) and losses determined by unitarity violation (bottom portion) of a conventional bandpass filter and of an improved bandpass filter.

While FIGS. 15 to 17 show the differences in behaviour for a single one-port resonator based on admittances, FIG. 18 shows a comparison of filter characteristics synthesized from the single resonator admittances for a conventional filter and for a filter comprising the improved electro acoustic resonators with gap short structures in series and in parallel paths (5 series+4 parallel=9 total→SPSPSPSPS).

The top portion of FIG. 17 shows the transfer function |S21| of a filter in a broad frequency range. The center portion shows the reflection coefficient |S11| at the input port of the corresponding filter. The bottom portion of FIG. 18 shows the frequency dependent global losses determined by the unitarity violation $1-|S21|^2-|S11|^2$.

In FIG. 18 curves 1 refer to a conventional filter while curves 2 correspond to a bandpass filter with improved resonators.

Especially within the passband ripples and insertion loss are reduced compared to the conventional filter. Also, losses corresponding to the ripples shown in the top portion of FIG. 18 are reduced.

Further, the passband skirts have an increased steepness supporting narrowband transitions between a passband and stopband.

Figure 19:
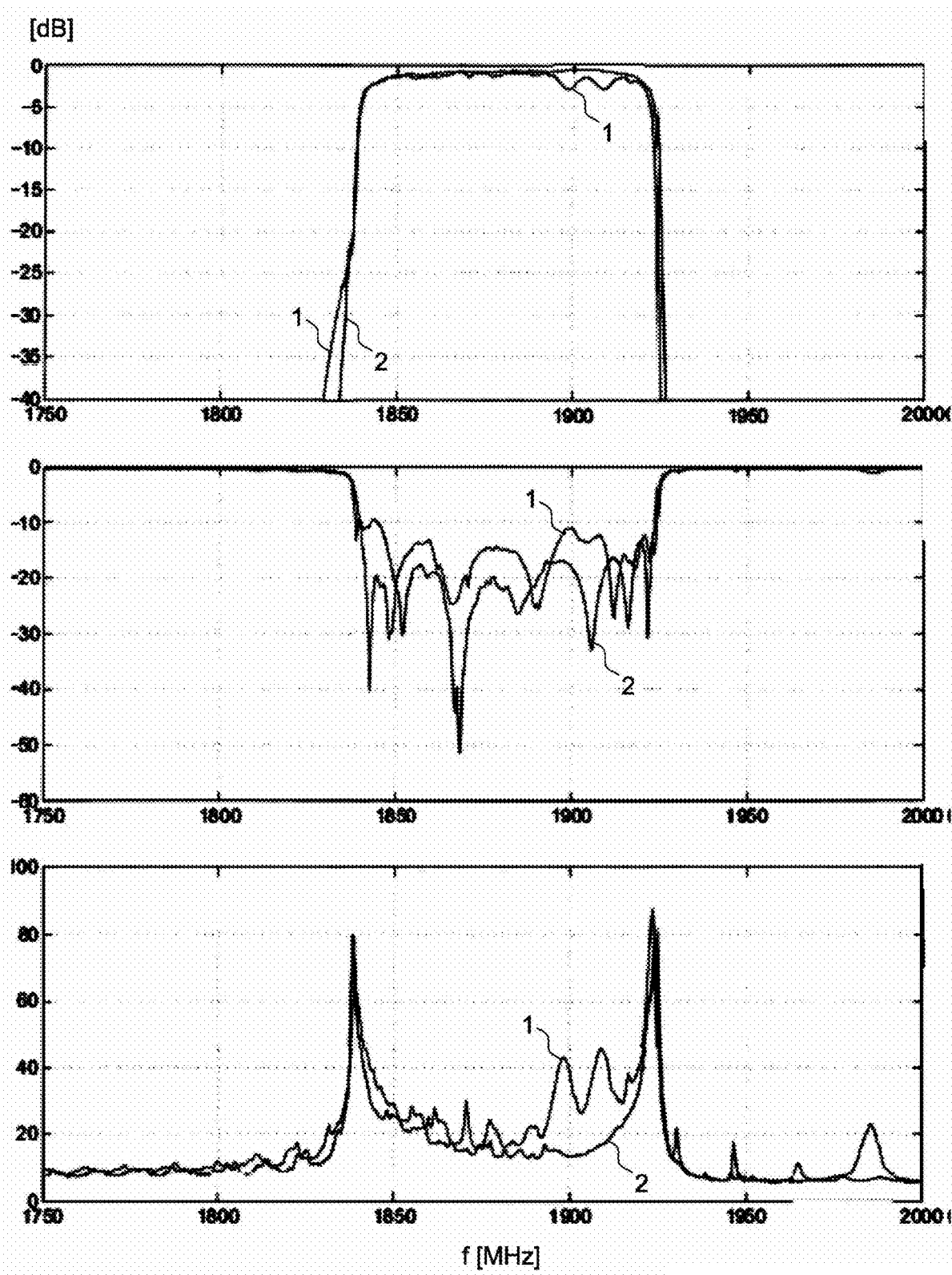
FIG. 19 shows a zoomed view of FIG. 18.

FIG. 19 shows the curves shown in FIG. 18 in a zoomed frequency range clearly indicating that ripples and disturbances inside the passband are significantly reduced in the filter based on the improved resonators.

Figure 20:
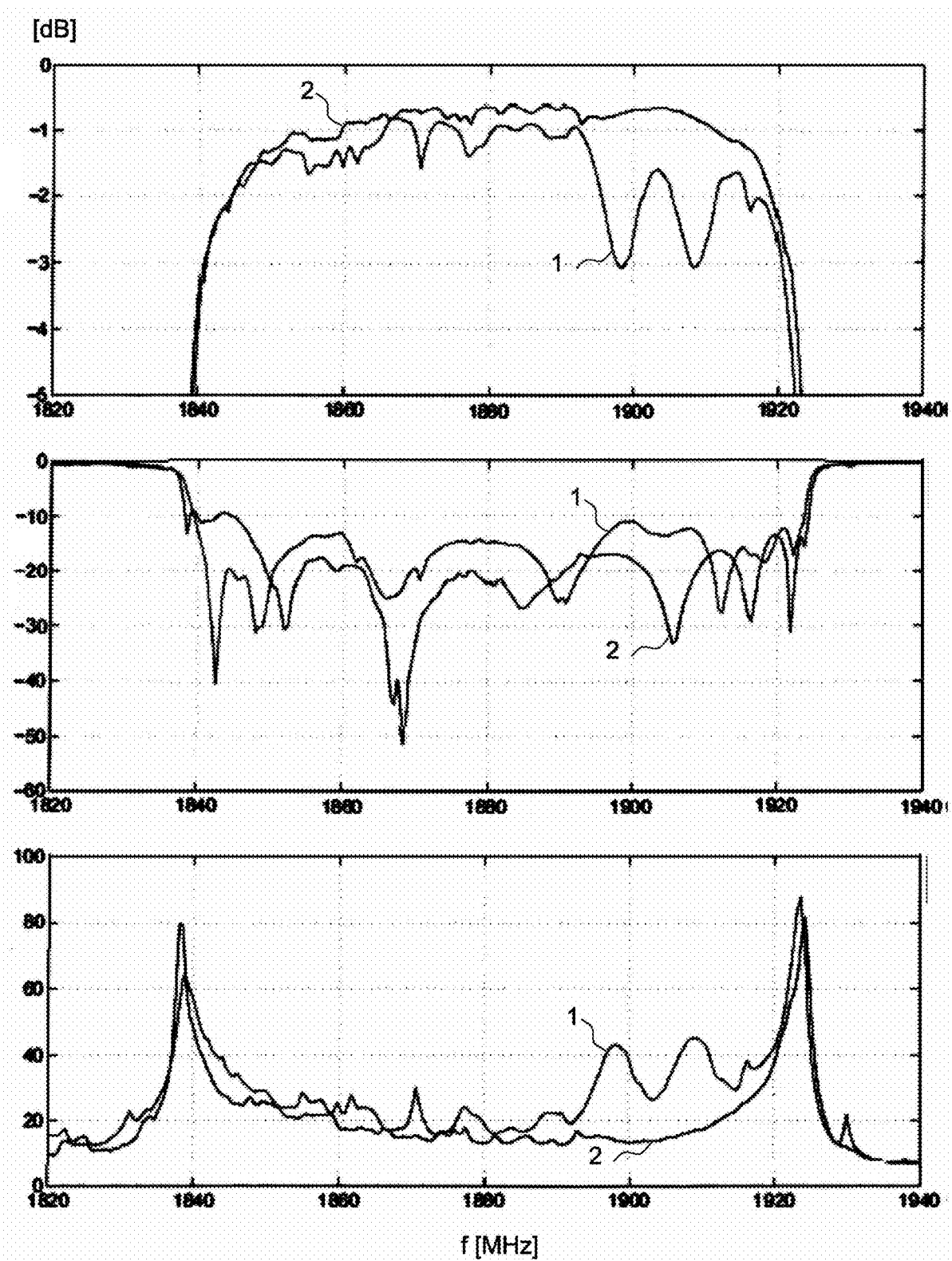
FIG. 20 shows a further zoomed view of FIG. 19.

FIG. 20 shows a further zoomed view of FIG. 19 clearly indicating not only that ripples and disturbances are reduced in the filter based on the improved resonators, but also the overall insertion attenuation and global losses quantified by the unitarity violation inside the entire passband.

Figure 21:
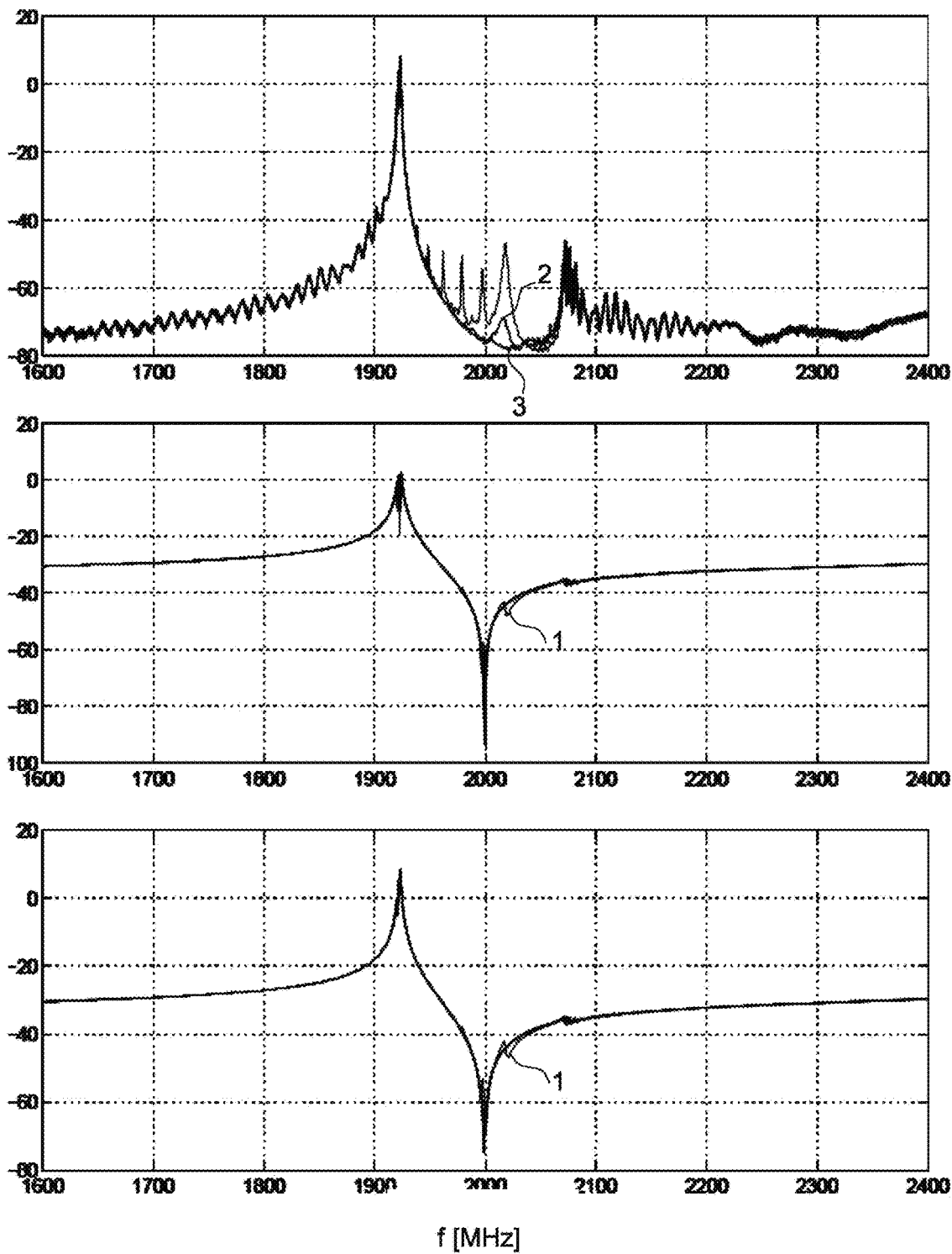
FIGS. 21 to 26 show a comparison between properties of conventional and improved one resonating structure.

FIG. 21 shows Admittance (Y) Parameters (top: real part of Y; middle: imaginary part of Y; bottom: absolute value of Y) for a standard one port resonator (curve 1) and two improved resonators, a gapshort realization according to the easiest embodiment shown in FIG. 4 (curve 2) and a gapshort realization according to the TGR structure shown in FIG. 13 (curve 3).

Figure 22:
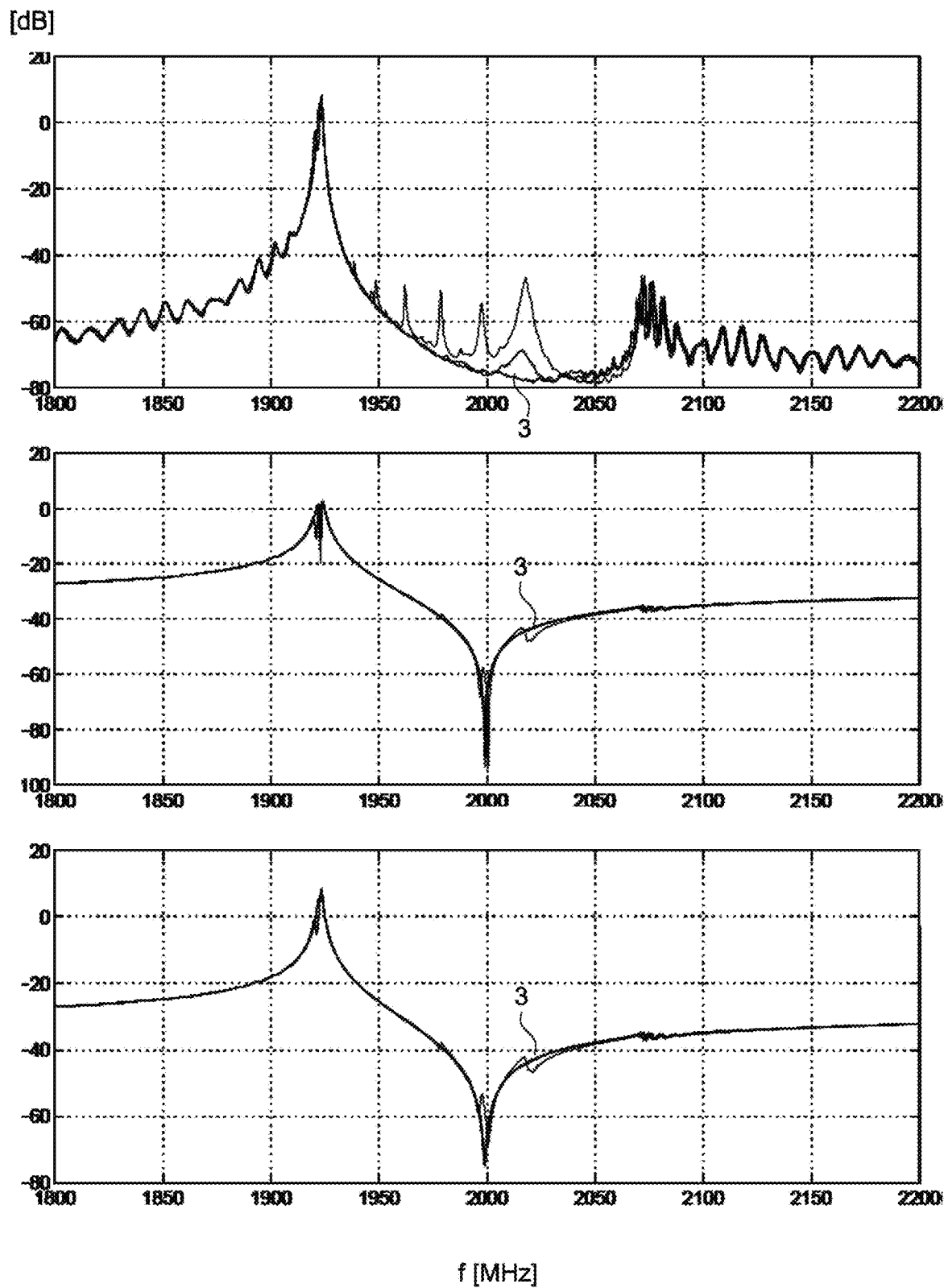

FIG. 22 shows FIG. 21 in a zoomed frequency range.

Figure 23:
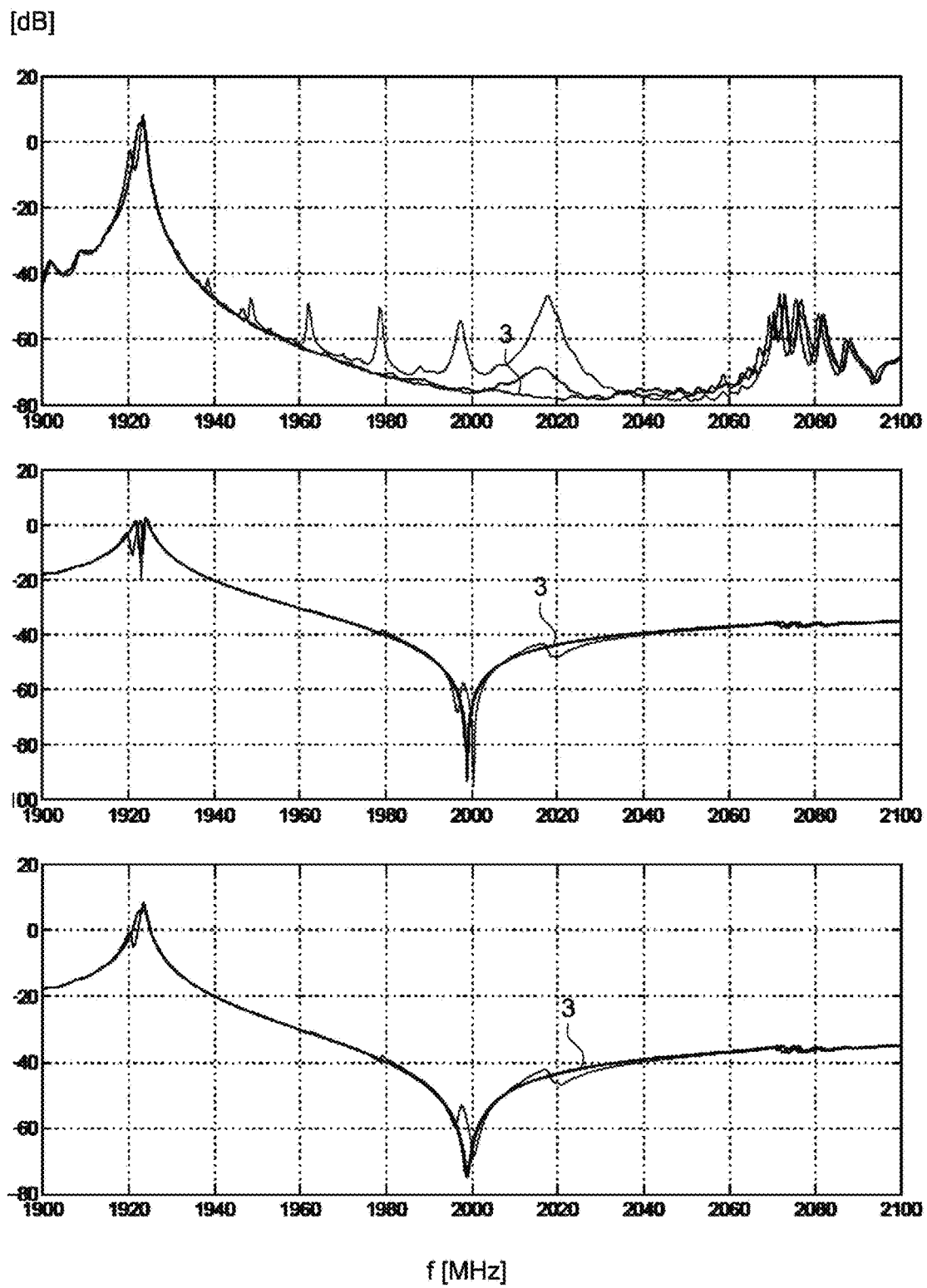

FIG. 23 shows FIG. 22 in a still further zoomed frequency range.

Figure 24:
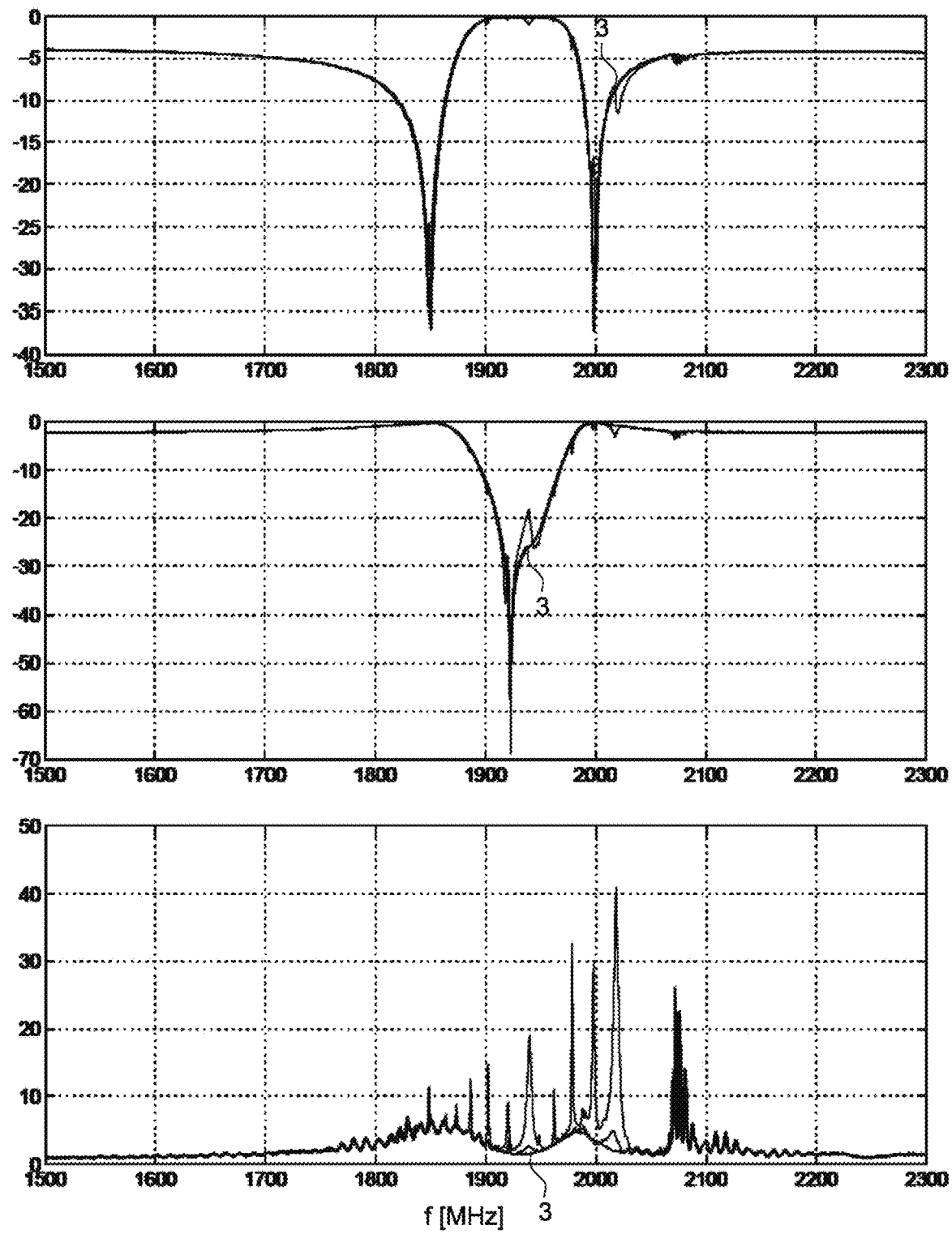

FIG. 24 shows S-Parameters (S) (top: $|S_{21}|$; middle: $|S_{11}|$) and the unitary violation at input port 1 (bottom: $UV_1$ [%]) of a basic section of a ladder type filter based on the standard resonator and the two improved resonators of FIGS. 21 to 23

Figure 25:
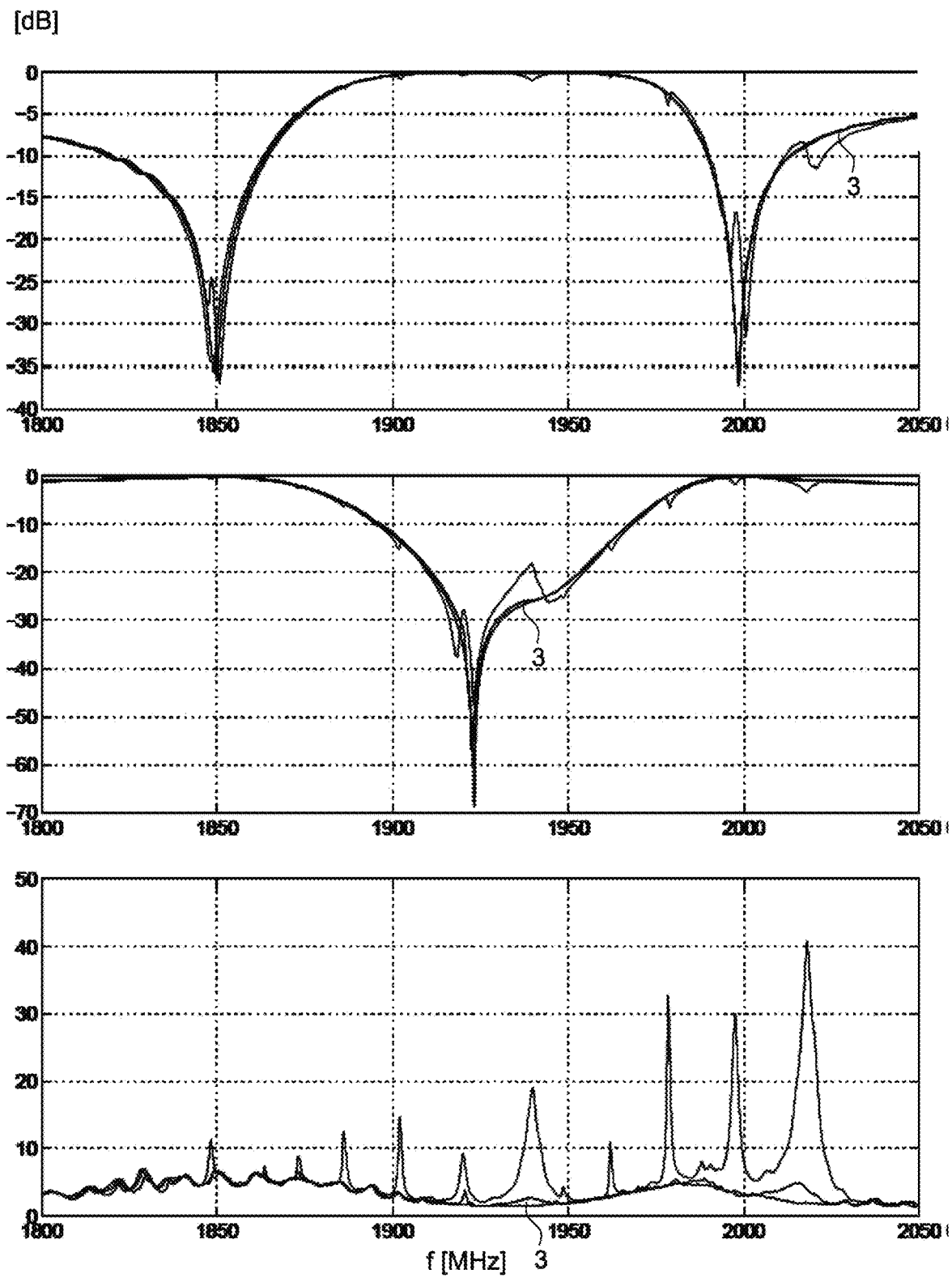

FIG. 25 shows FIG. 24 in a zoomed frequency range.

Figure 26:
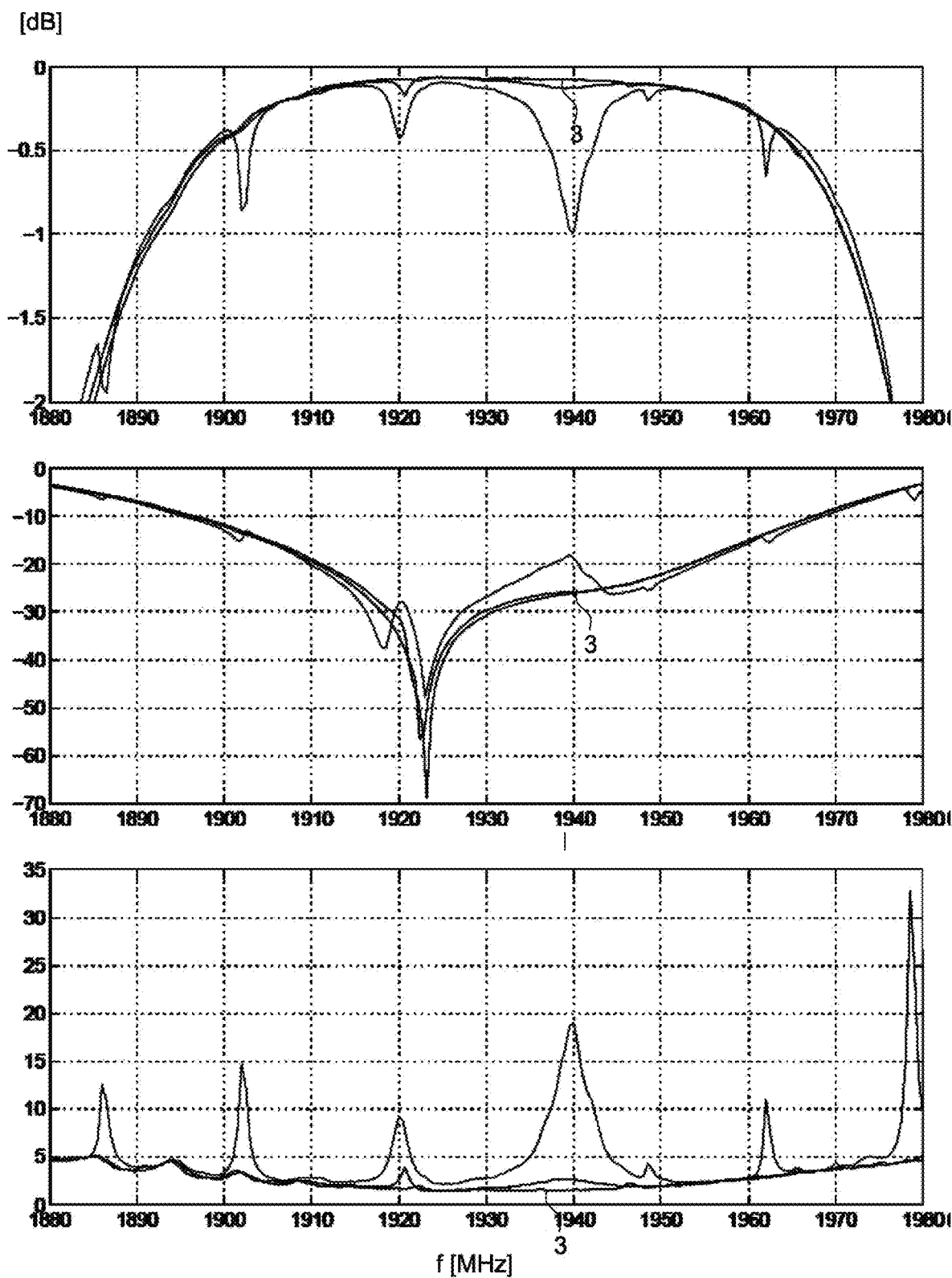

FIG. 26 FIG. 25 in a still further zoomed frequency range.

FIGS. 21 to 26 refer to structures where in a first improved resonator structure one longitudinal strip is present as a gap short structure (curve 2). In the further improved structure a plurality of strips in a TGR structure is present (curve 3).

It can be seen that the TGR structure completely suppresses the transversal gap mode below approx. 2020 MHz in FIGS. 21 to 23. It has to be mentioned that the mode splitting of the resonance and the small peak slightly below 1950 MHz are just occurring because the piston mode working point is not at its optimum and both will disappear when the optimum piston mode working point is chosen.

In FIGS. 24 to 26 it can be seen that the basic section including the TGR completely suppresses the transversal gap modes at approx. 1940 MHz and 2020 MHz. The abovementioned mode splitting shows up in curve 3 as a disturbance around 1850 MHz and a dip around 1920 MHz. As explained above, both can be avoided by choosing the optimum piston mode working point.

Figure 27:
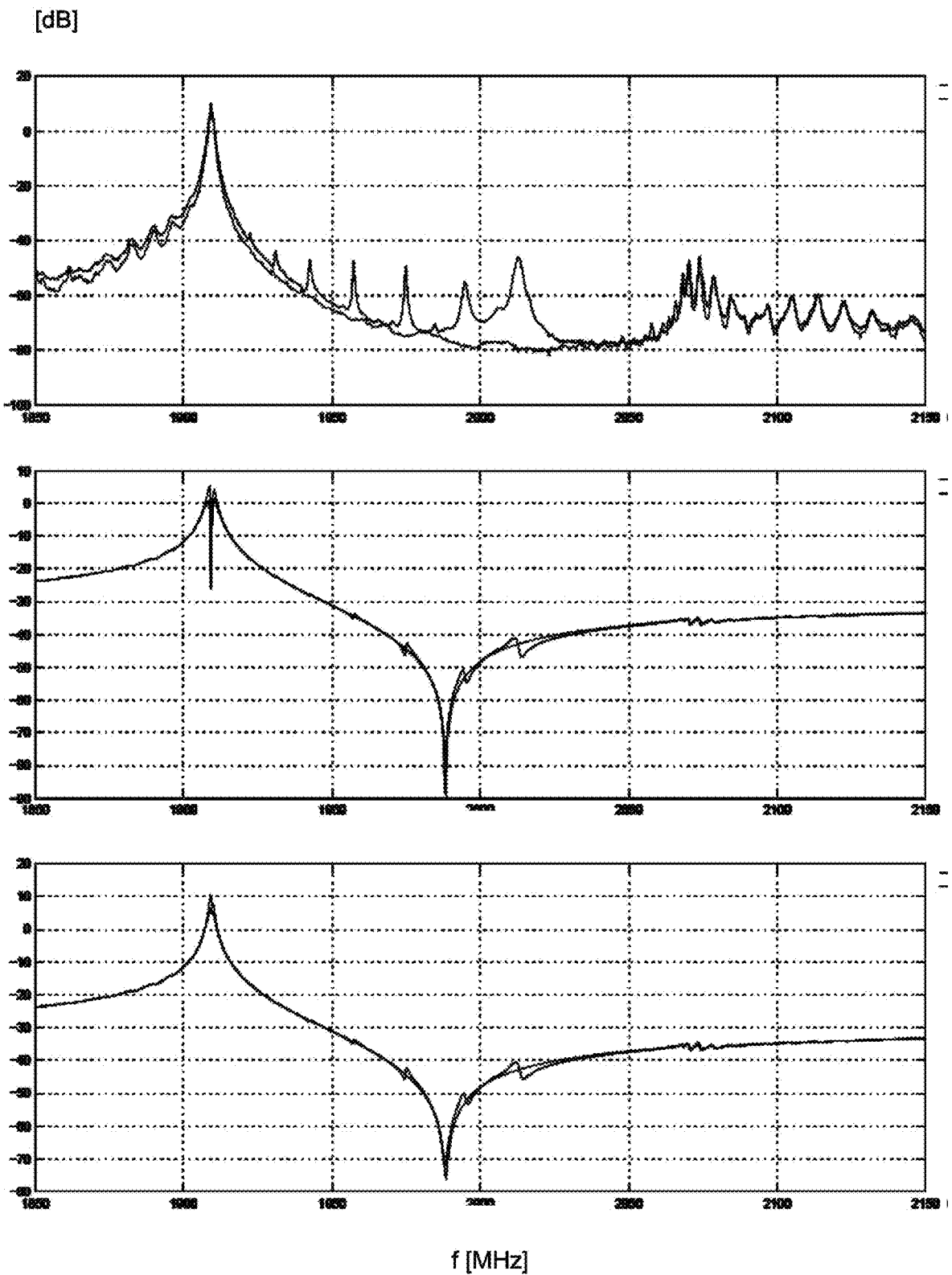
FIG. 27 shows a comparison between properties of conventional and improved one resonating structure active at its optimal working point.

FIG. 27 shows Admittance (Y) Parameters (top: real part of Y; middle: imaginary part of Y; bottom: absolute value of Y) for a standard one port resonator (curve 1) and an improved resonator with a TGR structure according to FIG. 13 (curve 2) at its optimal piston mode working point. At the optimal piston mode working point even the abovementioned mode splitting of the resonance (e.g. indicated in FIGS. 21 to 23) is not present.

Figure 28:
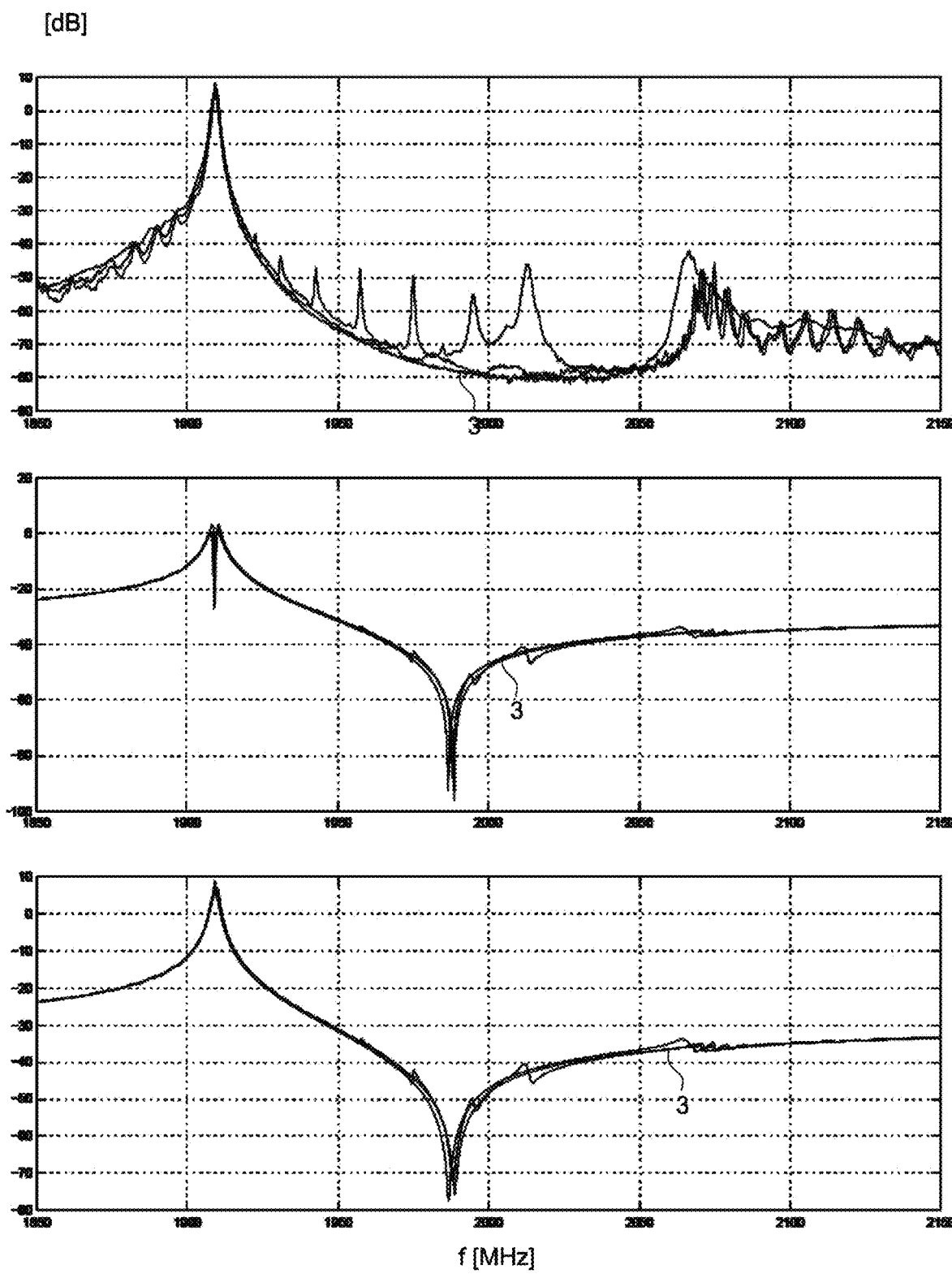
FIGS. 28 to 31 show a comparison between properties of a conventional one-port resonator, a one-port resonator with a TGR structure and a resonator with a slanted IDT (inter digital transducer).

FIG. 28 shows Admittance (Y) Parameters (top: real part of Y; middle: imaginary part of Y; bottom: absolute value of Y) for a conventional one-port resonator (curve 1), an improved resonator with a TGR structure (curve 2) and a slanted resonator (curve 3).

Figure 29:
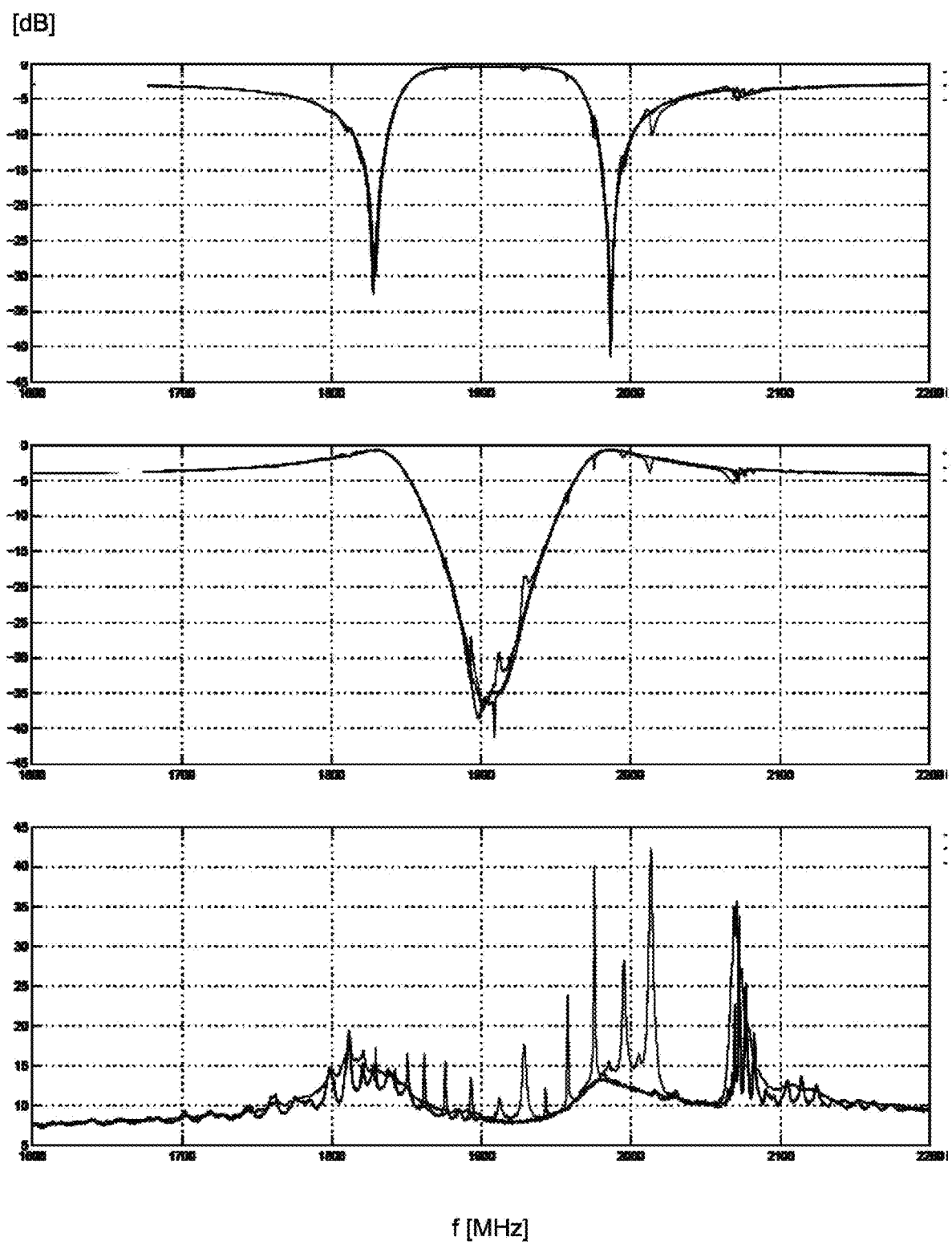

FIG. 29 shows S-Parameters (S) (top: $|S_{21}|$; middle: $|S_{11}|$) and the unitary violation (bottom: $UV_1$ [%]) of a basic section of a ladder type filter based on the standard resonator, the improved resonator with a TGR structure and the slanted resonator of FIG. 28.

Figure 30:
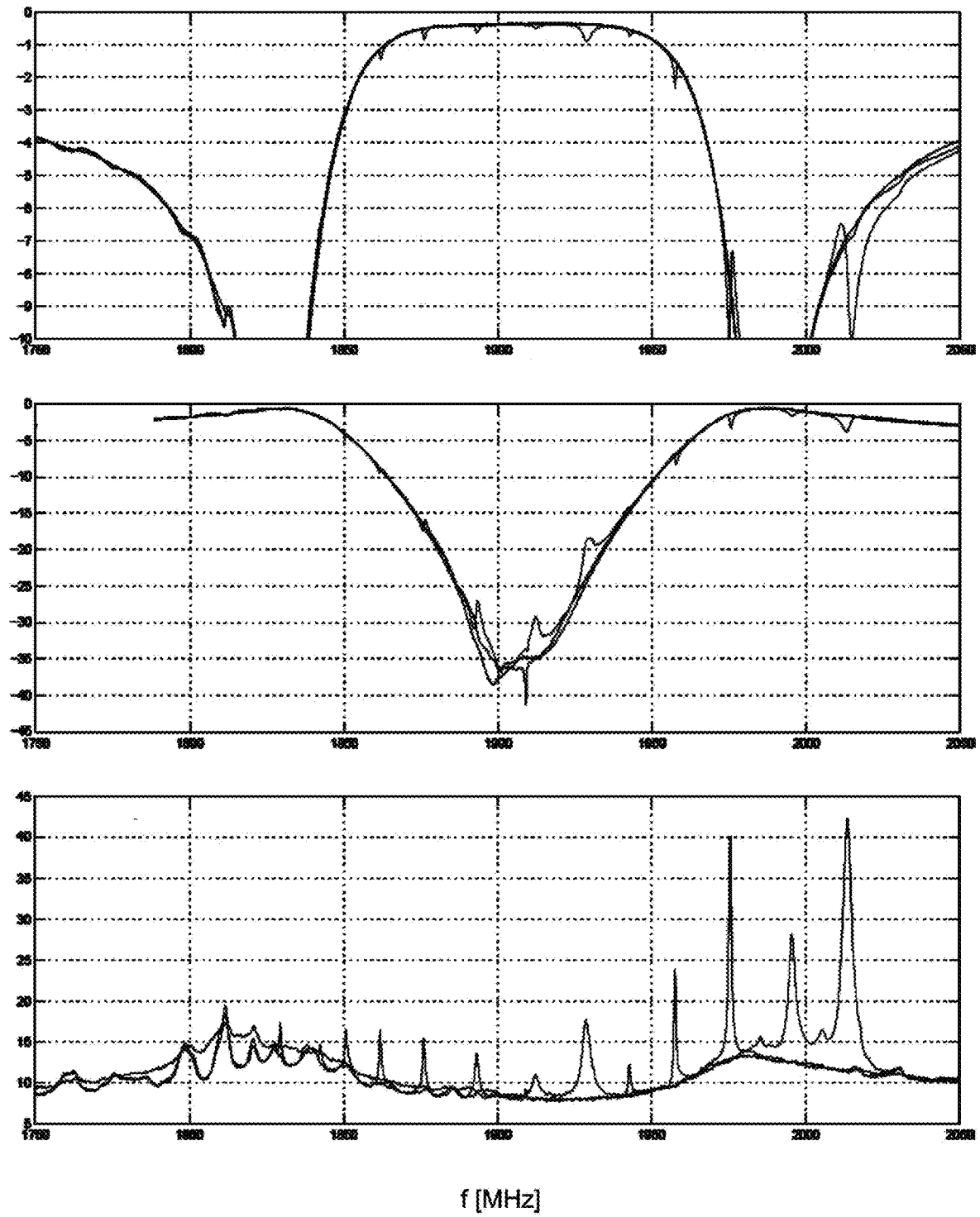

FIG. 30 shows FIG. 29 in a zoomed frequency range.

Figure 31:
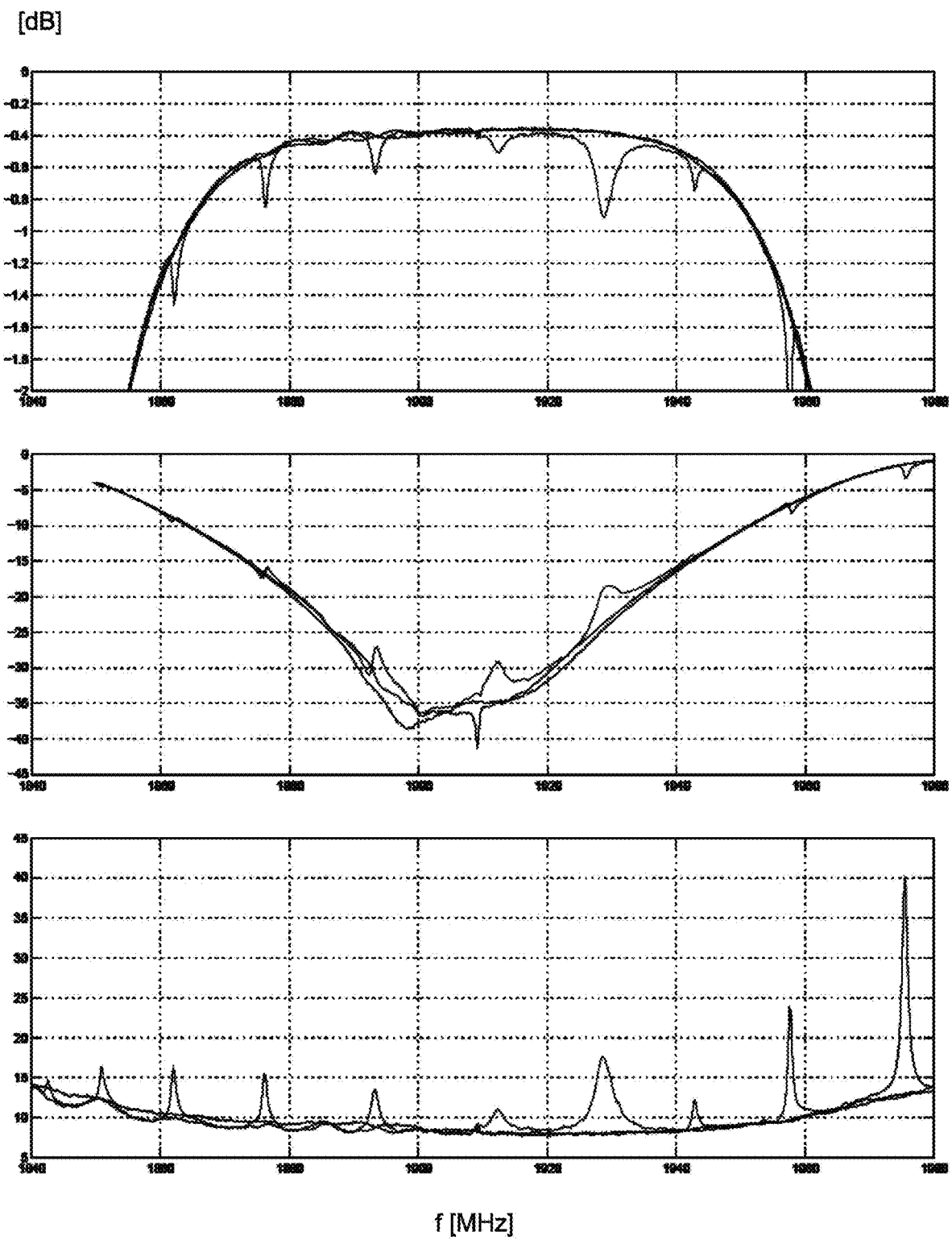

FIG. 31 shows FIG. 30 in a still further zoomed frequency range.

The frequency dependent parameters shown in the figures providing the best electrical performance (e.g. by reduced ripple, reduced loss, . . . ) correspond to structures where some or all the above means have been applied.

Compared to the use of slanted IDTs (alternative for transversal mode suppression) the use of the gap short structure needs less space, does not restrict filter designers in terms of topology, and complies with the known methods for obtaining a piston mode and simulating the acoustic behavior of the structures. Further, the use of the gap short structure—when compared to designs with slanted IDTs—reduces losses, especially in the left half of a passband. Further, by applying a longitudinal piston mode (e.g. via chirping or via a variation of the IDT reflector pitch) pass band ripple can be further reduced than in solutions with slanted IDTs.

The electro acoustic resonator and the corresponding filter are not limited by the technical details described above and shown in the figures. Resonators comprising further structured elements such as reflector structures and resonators comprising further layers such as temperature compensation layers, passivation layers or trim layers are also comprised.

LIST OF REFERENCE SIGNS

1: property of conventional resonator/filter
2: property of improved resonator/filter
BB: busbar
BBC: busbar connector
CEA: central excitation area
D, DTGR: distance
EAR: electro acoustic resonator
EF: electrode finger
G: gap
GSS: gap short structure
IDS: interdigitated structure
P, PTGR: pitch
PBBC: pitch
PM: piezoelectric material
R: reflector
W: width

The invention claimed is:

1. An electro acoustic resonator with suppressed transversal gap mode excitation and reduced transversal modes, comprising:
a piezoelectric material;
an electrode structure arranged on or above the piezoelectric material; and
a gap short structure arranged on or above the piezoelectric material; wherein:
the electrode structure has two opposite busbars, two transversal gaps and electrode fingers,
each electrode finger is alternately electrically connected to one of the busbars,
the transversal gaps are arranged between the end of electrode fingers and the respective opposite busbar, and
the gap short structure has conductor strips or patches and is arranged inside the transversal gaps.

2. The resonator of the claim 1, wherein the gap short structure electrically shorts an area of the gaps.

3. The resonator of claim 1, wherein the conductor strips of the gap short structure extend in a longitudinal direction.

4. The resonator of claim 1, wherein the conductor strips of the gap short structure and the electrode fingers share a same metal layer.

5. The resonator of claim 1, being selected from a SAW resonator, a TC-SAW resonator, a TF-SAW resonator, a GBAW resonator provided as a one-port resonator, a two-port resonator or a DMS resonator.

6. The resonator of claim 1, further comprising busbar connectors electrically connecting the gap short structure to the busbars.

7. The resonator of claim 6, wherein the busbar connectors comprise one or more structures selected from:
electrode finger elements,
electrode finger elements with an increased metallization ratio η,
electrode finger elements with a reduced metallization ratio η,
phase shifted electrode finger elements,
phase shifted conductor patches,
phase shifted electrode finger elements with an increased metallization ratio η,
phase shifted electrode finger elements with a reduced metallization ratio η,
asynchronous conductor patches with an increased pitch p,
asynchronous conductor patches with a reduced pitch p,
asynchronous conductor patches with an irregular pitch p,
rotated conductor patches,
trapezoid conductor patches,
wherein in case of a TGR structure busbar connector conductor patches which are modified from one gap short conductor strip to the next.

8. The resonator of claim 1, wherein the gap short structures' conductor strips comprise one or more structures selected from
rectangular conductor strips,
rotated conductor strips,
trapezoid conductor strips,
a transversal gapshort reflector, TGR, including a plurality of conductor strips per side of an acoustic track.

9. The resonator of claim 1, wherein the resonator is part of an electro acoustic filter.

10. The resonator of claim 1, wherein the resonator is part of a multiplexer.

11. The resonator of claim 1, wherein the resonator is manufactured at least in part by creating the conductor strips of the gap short structure in the transversal gaps.

12. A method of reducing excitation of transversal gap modes in an electro acoustic resonator, comprising:
electrically shorting an area of transversal gaps of the electro acoustic resonator.

13. The method of claim 12, comprising:
electrically shorting the area of the transversal gaps via a gap short structure,
providing the gap short structure as conductive strips,
determining a width of the strips and distances between the strips and the electrode finger tips and between the strips and the busbars.

14. The method of claim 12, comprising:
providing a TGR structure including a plurality of strips extending along a longitudinal direction; and
selecting widths and distances of the plurality of strips towards electrode finger tips, the busbar and neighboring strips.

* * * * *